US012651565B2

(12) United States Patent
Kim et al.

(10) Patent No.: US 12,651,565 B2
(45) Date of Patent: Jun. 9, 2026

(54) DISPLAY DEVICE

(71) Applicant: Samsung Display Co., Ltd., Yongin-Si (KR)

(72) Inventors: Tae-Ho Kim, Yongin-si (KR); Seung-Jun Lee, Yongin-si (KR); Yongsu Lee, Yongin-si (KR); Jaewoo Lee, Yongin-si (KR); Seung-Hwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/741,773

(22) Filed: Jun. 13, 2024

(65) Prior Publication Data

US 2025/0046242 A1     Feb. 6, 2025

(30) Foreign Application Priority Data

Aug. 1, 2023    (KR) ........................ 10-2023-0100609

(51) Int. Cl.
| | |
|---|---|
| *H10K 59/126* | (2023.01) |
| *G09G 3/3225* | (2016.01) |
| *G09G 3/3233* | (2016.01) |
| *H10K 59/131* | (2023.01) |

(52) U.S. Cl.
CPC ......... *G09G 3/3225* (2013.01); *H10K 59/126* (2023.02); *H10K 59/131* (2023.02); *G09G 3/3233* (2013.01); *G09G 2300/0426* (2013.01)

(58) Field of Classification Search
CPC ...... G09G 3/30; G09G 3/3208; G09G 3/3225; G09G 3/3233; G09G 3/3266; G09G 2300/0426; H10K 59/12; H10K 59/1213; H10K 59/126; H10K 59/131
See application file for complete search history.

(56) References Cited

U.S. PATENT DOCUMENTS

| | | | |
|---|---|---|---|
| 10,482,817 B2 | 11/2019 | Kim et al. | |
| 2019/0005885 A1* | 1/2019 | Kim ........................ | H10D 86/60 |
| 2021/0280140 A1* | 9/2021 | Lee ........................ | H10D 86/60 |

* cited by examiner

*Primary Examiner* — Julie Anne Watko
(74) *Attorney, Agent, or Firm* — Innovation Counsel LLP

(57) ABSTRACT

A display device including: a display panel containing pixels connected to a light emitting control line and a light emitting control driver including a light emitting control stage that provides a light emitting control signal to the pixels through the light emitting control line, wherein the light emitting control stage includes: a first light emitting control transistor including a first electrode connected to the light emitting control line, a gate electrode connected to a first light emitting control clock line, and a second electrode connected to a first node, a first power voltage line to which a first power voltage is applied; and a shielding pattern extending between the first light emitting control transistor and the first power voltage line and receiving a power voltage higher than the first power voltage.

12 Claims, 17 Drawing Sheets

DISPLAY DEVICE

CROSS-REFERENCE TO RELATED APPLICATION(S)

This application claims priority to and benefits, under 35 U.S.C. § 119, of Korean Patent Application No. 10-2023-0100609 filed on Aug. 1, 2023 in the Korean Intellectual Property Office (KIPO), the entire contents of which are incorporated herein by reference.

BACKGROUND

1. Technical Field

This disclosure relates to a display device.

2. Description of the Related Art

A display device includes a pixel and a driver for driving the pixel. The driver includes a plurality of transistors and a power voltage line to which a power voltage is applied. When the transistor is disposed near the power voltage line, the presence of the power voltage line sometimes shifts the threshold voltage of the transistor. Accordingly, reliability of the driver may be deteriorated.

SUMMARY

Embodiments provide a display device including a driver with improved reliability.

A display device according to an embodiment includes a display panel containing pixels connected to a light emitting control line and a light emitting control driver including a light emitting control stage that provides a light emitting control signal to the pixels through the light emitting control line.

In an embodiment, the light emitting control stage may include a first light emitting control transistor including a first electrode connected to the light emitting control line, a gate electrode connected to a first light emitting control clock line, and a second electrode connected to a first node, a first power voltage line to which a first power voltage is applied, and a shielding pattern extending between the first light emitting control transistor and the first power voltage line and receiving a power voltage higher than the first power voltage.

In an embodiment, the light emitting control stage may further include a second power voltage line to which a second power voltage higher than the first power voltage is applied.

In an embodiment, the shielding pattern is connected to the second power voltage line through a contact hole.

In an embodiment, the light emitting control stage may further include a first capacitor including a first electrode connected to the second power voltage line and a second electrode connected to a second node.

In an embodiment, the shielding pattern may be disposed on the same layer as the second electrode of the first capacitor.

In an embodiment, the light emitting control stage may further include a second light emitting control transistor including a first electrode connected to the first power voltage line, a gate electrode connected to a third node, and a second electrode connected to a fourth node.

In an embodiment, the shielding pattern may extend between the second light emitting control transistor and the first power voltage line.

In an embodiment, the light emitting control stage may further include a third light emitting control transistor including a first electrode connected to a fifth node, a gate electrode connected to the first power voltage line, and a second electrode connected to a sixth node.

In an embodiment, the shielding pattern may extend between the third light emitting control transistor and the first power voltage line.

In an embodiment, the first power voltage line may extend in a first direction.

In an embodiment, the shielding pattern may include a first part extending in the first direction and a second part extending in a second direction crossing the first direction.

In an embodiment, the light emitting control stage may further include a light emitting blocking signal line receiving a light emitting blocking signal.

In an embodiment, the second part of the shielding pattern may partially overlap the light emitting blocking signal line.

In an embodiment, the first part of the shielding pattern may be disposed between the first light emitting control transistor and the first power voltage line.

A display device according to an embodiment includes an active pattern including a first area, a second area spaced apart from the first area, and a first channel area disposed between the first area and the second area, a first gate electrode disposed on the active pattern, a second gate electrode disposed on the first gate electrode and including a 2-1 sub-gate electrode and a 2-2 sub-gate electrode, a first light emitting control clock line disposed on the second gate electrode and extending in a first direction, a first power voltage line disposed on the second gate electrode, extending in the first direction and receiving a first power voltage, a second power voltage line disposed on the second gate electrode, extending in the first direction and receiving a second power voltage higher than the first power voltage, a light emitting control line disposed on the first power voltage line, connected to the first area of the active pattern, and applied with a light emitting control signal and a first light emitting control transistor including the first channel area of the active pattern, at least a portion of the first area of the active pattern, at least a portion of the second area of the active pattern, and a portion of the first gate electrode overlapping the first channel area of the active pattern.

In an embodiment, the 2-1 sub-gate electrode may extend between the first channel area of the active pattern and the first power voltage line.

In an embodiment, the 2-1 sub-gate electrode may include a first part extending in the first direction and a second part extending in a second direction crossing the first direction.

In an embodiment, the first part of the 2-1 sub-gate electrode may extend to be disposed between the first channel area of the active pattern and the first power voltage line.

In an embodiment, the display device may further include light emitting blocking signal line to which a light emitting blocking signal is applied.

In an embodiment, the second part of the 2-1 sub-gate electrode may partially overlap the light emitting blocking signal line, and may be connected to the second power voltage line through a contact hole.

In an embodiment, the active pattern may further include a third area connected to the first power voltage line, a fourth area spaced apart from the third area, and a second channel area disposed between the third area and the fourth area.

In an embodiment, the display device may further include a second light emitting control transistor including the second channel area of the active pattern, at least a portion of the third area of the active pattern, at least a portion of the fourth area of the active pattern, and a portion of the first gate electrode overlapping the second channel area of the active pattern.

In an embodiment, the first part of the 2-1 sub-gate electrode may extend between the second channel area of the active pattern and the first power voltage line.

In an embodiment, the active pattern may further include a fifth area, a sixth area spaced apart from the fifth area, and a third channel area disposed between the fifth area and the sixth area.

In an embodiment, the display device may further include a third light emitting control transistor including the third channel area of the active pattern, at least a portion of the fifth area of the active pattern, at least a portion of the sixth area of the active pattern, and a portion of the first gate electrode overlapping the third channel area of the active pattern.

In an embodiment, the first part of the 2-1 sub-gate electrode may extend between the third channel area of the active pattern and the first power voltage line.

The display device according to an embodiment may include a light emitting control driver. The light emitting control driver may include at least one light emitting control transistor disposed adjacent to a first power voltage line. In addition, the light emitting control driver may include a shielding pattern extending to be disposed between the first power voltage line and the light emitting control transistor. The shielding pattern may be connected to a second power voltage line to which a positive voltage is applied.

As the shielding pattern in which a positive voltage is applied is disposed between the light emitting control transistor and the first power voltage line, a positive charge accumulated on an upper portion of a substrate by the first power voltage line to which a negative voltage is applied may be prevented. As the positive charges accumulated on the upper portion of the substrate is prevented, a threshold voltage of the light emitting control transistor may be prevented from being negatively shifted.

BRIEF DESCRIPTION OF THE DRAWINGS

Illustrative, non-limiting embodiments will be more clearly understood from the following detailed description in conjunction with the accompanying drawings.

FIG. 2 is a block diagram illustrating the display device of FIG. 1.

FIG. 4 is a circuit diagram illustrating a light emitting control driver included in the display device of FIG. 2.

FIGS. 5, 6, 7, 8, 9, 10, 11, 12, and 13 are layout diagrams illustrating the display device of FIG. 1.

FIG. 16 is a cross-sectional view taken along line XVI-XVI' of FIG. 13

DETAILED DESCRIPTION OF THE EMBODIMENTS

Figure 1:
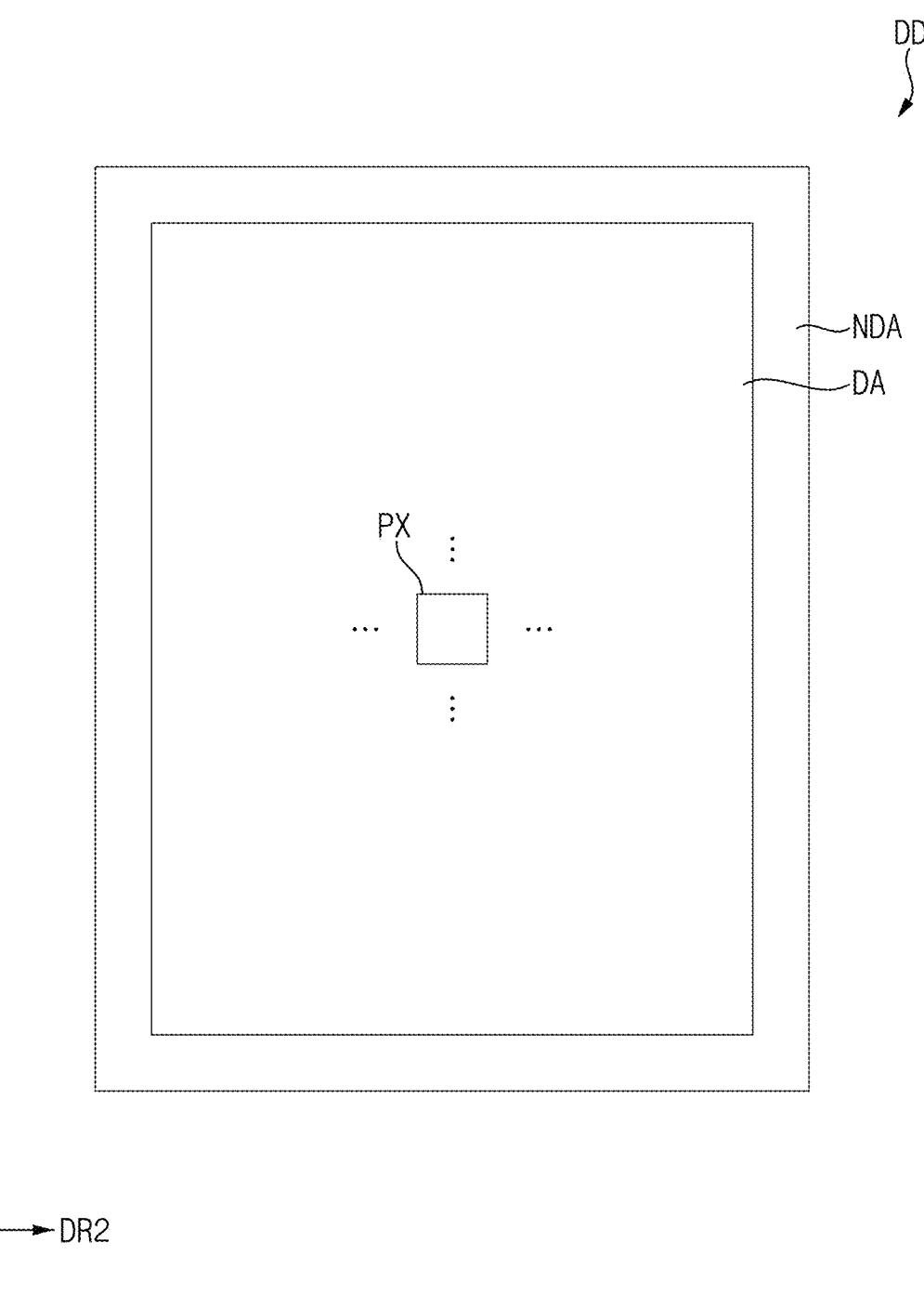
FIG. 1 is a plan view illustrating a display device according to an embodiment.

Hereinafter, display devices in accordance with embodiments will be described in more detail with reference to the accompanying drawings. The same reference numerals are used for the same components in the drawings, and redundant descriptions of the same components will be omitted.

Figure 2:
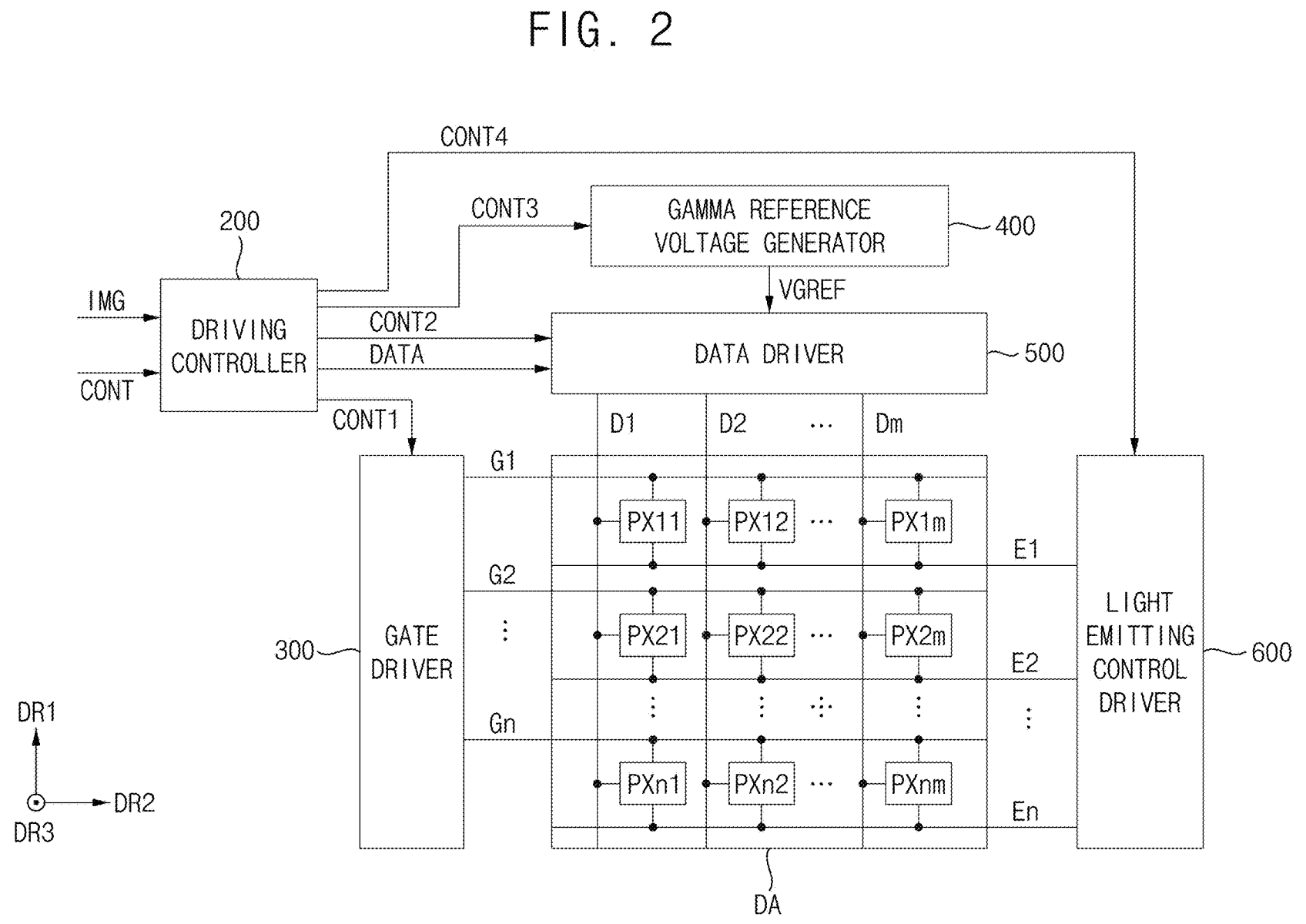

FIG. 1 is a plan view illustrating a display device according to an embodiment. FIG. 2 is a block diagram illustrating the display device of FIG. 1.

Referring to FIG. 1, a display device DD according to an embodiment may include a display area DA and a non-display area NDA. The display area DA may be defined as an area capable of generating light or displaying an image by adjusting a transmittance of light provided from an external light source. The non-display area NDA may be an area that does not display an image. In addition, the non-display area NDA may be disposed around at least a portion of the display area DA.

A plurality of pixels PX may be disposed in the display area DA. Each of the plurality of pixels PX may emit light. The plurality of pixels PX may be repeatedly arranged along a first direction DR1 and a second direction DR2 crossing the first direction DR1.

Referring to FIGS. 1 and 2, a driver may be disposed in the non-display area NDA. The driver may include a driving controller 200, a gate driver 300, a gamma reference voltage generator 400, a data driver 500, and a light emitting control driver 600.

The display area DA may include a plurality of scan lines G1, G2, . . . , Gn, a plurality of data lines D1, D2, . . . , Dm and a plurality of light emitting control lines E1, E2, . . . , En.

In addition, the display area DA may include a plurality of pixels PX11, PX12, . . . PX1$m$ disposed in a first row, a plurality of pixels PX21, PX22, . . . , PX2$m$ disposed in the second row, and a plurality of pixels PXn1, PXn2, . . . , PXnm disposed in a n-th row.

Each of the plurality of scan lines G1, G2, . . . , Gn and the plurality of light emitting control lines E1, E2, . . . , En may extend in the second direction DR2. In addition, the plurality of data lines D1, D2, . . . , Dm may extend in the first direction DR1.

The driving controller 200 may receive an input image data IMG and an input control signal CONT from an external device. According to an embodiment, the input image data IMG may include red image data, green image data, and blue image data. In another embodiment, the input image data IMG may include white image data. In another embodiment, the input image data IMG may include magenta image data, yellow image data, and cyan image data.

The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, a fourth control signal CONT4, and a data signal DATA based on the input image data IMG and the input control signal CONT.

The driving controller 200 may generate the first control signal CONT1 based on the input control signal CONT. The driving controller 200 may output the first control signal CONT1 to the gate driver 300. The first control signal CONT1 may include a vertical start signal and a gate clock signal.

The driving controller 200 may generate a second control signal CONT2 based on the input control signal CONT. The driving controller 200 may output the second control signal CONT2 to the data driver 500. The second control signal CONT2 may include a horizontal start signal and a load signal.

The driving controller 200 may generate a third control signal CONT3 based on the input control signal CONT. The driving controller 200 may output the third control signal CONT3 to the gamma reference voltage generator 400.

The driving controller 200 may generate a fourth control signal CONT4 based on the input control signal CONT. The driving controller 200 may output the fourth control signal CONT4 to the light emitting control driver 600.

The driving controller 200 may generate a data signal DATA based on the input image data IMG. The driving controller 200 may output the data signal DATA to the data driver 500.

In response to the first control signal CONT1 input from the driving controller 200, the gate driver 300 may generate a gate signal for driving the plurality of scan lines G1, G2, . . . , Gn. The gate driver 300 may output the gate signal to the plurality of scan lines G1, G2, . . . , Gn. For example, the gate signal may include a data initialization gate signal, a compensation gate signal, a data write gate signal, and the like.

The first scan line G1 may be electrically connected to each of the plurality of pixels PX11, PX12, . . . , PX1*m* disposed in the first row. The first scan line G1 may transfer the gate signal to each of the plurality of pixels PX11, PX12, . . . , PX1*m* disposed in the first row.

The second scan line G2 may be electrically connected to each of the plurality of pixels PX21, PX22, . . . , PX2*m* disposed in the second row. The second scan line G2 may transfer the gate signal to each of the plurality of pixels PX21, PX22, . . . , PX2*m* disposed in the second row.

The n-th scan line Gn may be electrically connected to each of the plurality of pixels PXn1, PXn2, . . . , PXnm disposed in the n-th row. The n-th scan line Gn may transfer the gate signal to each of the plurality of pixels PXn1, PXn2, . . . , PXnm disposed in the n-th row.

The gamma reference voltage generator 400 may generate a gamma reference voltage VGREF in response to the third control signal CONT3 input from the driving controller 200. The gamma reference voltage generator 400 may provide the gamma reference voltage VGREF to the data driver 500. The gamma reference voltage VGREF may have a value corresponding to each of the data signal DATA.

In an embodiment, the gamma reference voltage generator 400 may be spaced apart from the data driver 500. In another embodiment, the gamma reference voltage generator 400 may be disposed in the driving controller 200. In another embodiment, the gamma reference voltage generator 400 may be disposed in the data driver 500.

The data driver 500 may receive the second control signal CONT2 and the data signal DATA from the driving controller 200. In addition, the data driver 500 may receive the gamma reference voltage VGREF from the gamma reference voltage generator 400. The data driver 500 may convert the data signal DATA into an analog data voltage using the gamma reference voltage VGREF. The data driver 500 may output the data voltage to each of the plurality of data lines D1, D2, . . . , Dm.

The first data line D1 may be electrically connected to each of a plurality of pixels PX11, PX21, . . . , PXn1 disposed in the first column. The first data line D1 may transfer the data voltage to each of the plurality of pixels PX11, PX21, . . . , PXn1 disposed in the first column.

The second data line D2 may be electrically connected to each of a plurality of pixels PX12, PX22, . . . , PXn2 disposed in the second column. The second data line D2 may transfer the data voltage to each of the plurality of pixels PX12, PX22, . . . , PXn2 disposed in the second column.

The m-th data line Dm may be electrically connected to each of a plurality of pixels PX1*m*, PX2*m*, . . . , PXnm disposed in the m-th column. The m-th data line Dm may transfer the data voltage to each of the plurality of pixels PX1*m*, PX2*m*, . . . , PXnm disposed in the m-th column.

The light emitting control driver 600 may generate a light emitting control signal in response to the fourth control signal CONT4 input from the driving controller 200. The light emitting control driver 600 may output the light emitting control signal to each of the plurality of light emitting control lines E1, E2, . . . , En.

The first light emitting control line E1 may be electrically connected to each of the plurality of pixels PX11, PX12, . . . , PX1*m* disposed in the first row. The first light emitting control line E1 may transfer the light emitting control signal to each of the plurality of pixels PX11, PX12, . . . , PX1*m* disposed in the first row.

The second light emitting control line E2 may be electrically connected to each of the plurality of pixels PX21, PX22, . . . , PX2*m* disposed in the second row. The second light emitting control line E2 may transfer the light emitting control signal to each of the plurality of pixels PX21, PX22, . . . , PX2*m* disposed in the second row.

The n-th light emitting control line En may be electrically connected to each of the plurality of pixels PXn1, PXn2, . . . , PXnm disposed in the n-th row. The n-th light emitting control line En may transfer the light emitting control signal to each of the plurality of pixels PXn1, PXn2, . . . , PX2*m* disposed in the n-th row.

In FIG. 2, the gate driver 300 may be disposed in the non-display area NDA adjacent to a first side of the display area DA, and the light emitting control driver 600 may be disposed in the non-display area NDA adjacent to a second side of the display area DA. However, this disclosure is not limited to the example arrangement of FIG. 2.

For example, the gate driver 300 and the light emitting control driver 600 may be disposed in the non-display area NDA adjacent to the first side of the display area DA. In some embodiments, the gate driver 300 and the light emitting control driver 600 may be integrally formed.

Figure 3:
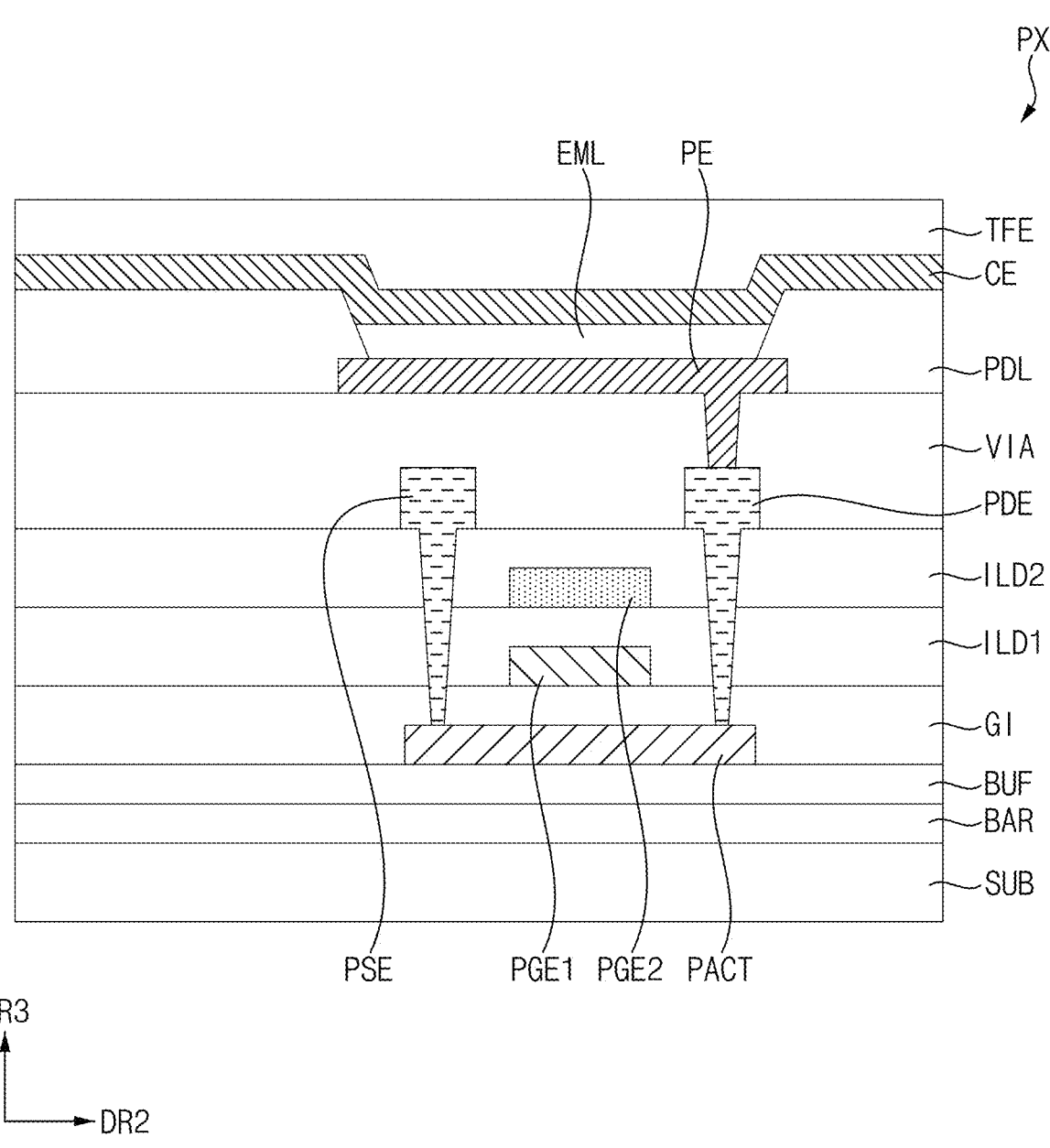
FIG. 3 is a cross-sectional view illustrating a pixel included in the display device of FIG. 1.

FIG. 3 is a cross-sectional view illustrating a pixel included in the display device of FIG. 1.

Referring to FIG. 3, the pixel PX may include a substrate SUB, a barrier layer BAR, a buffer layer BUF, a gate insulating layer GI, a first interlayer insulating layer ILD1, a second interlayer insulating layer ILD2, a via insulating layer VIA, an active pattern PACT, a source electrode PSE, a first gate electrode PGE1, a second gate electrode PGE2, a drain electrode PDE, a pixel electrode PE, a pixel defining layer PDL, a light emitting layer EML, a common electrode CE, and an encapsulating layer TFE.

The substrate SUB may include a transparent material or an opaque material. The substrate SUB may be formed of a transparent resin substrate. Example of the transparent resin substrate may include a polyimide substrate. In this case, the polyimide substrate may include a first organic layer, a first barrier layer, a second organic layer, and the like.

Alternatively, the substrate SUB may include a quartz substrate (e.g., a synthetic quartz substrate, a fluorine-doped quartz substrate), a calcium fluoride substrate, a sodalime substrate, a non-alkali glass substrate, or the like. These materials may be used alone or in combination with each other.

The barrier layer BAR may be disposed on the substrate SUB. The barrier layer BAR may prevent impurities from penetrating into an upper portion of the substrate SUB from the outside. For example, the barrier layer BAR may include an inorganic material such as silicon oxide, silicon nitride, silicon oxynitride, or the like. These materials may be used alone or in combination with each other. In addition, the barrier layer BAR may be formed in a single layer structure or a multilayer structure.

The buffer layer BUF may be disposed on the barrier layer BAR. The buffer layer BUF may prevent metal atoms or impurities from diffusing from the substrate SUB to the active pattern PACT.

In some embodiments, the buffer layer BUF may include an inorganic material such as silicon oxide, silicon nitride, silicon oxynitride, or the like. These materials may be used alone or in combination with each other.

The active pattern PACT may be disposed on the buffer layer BUF. The active pattern PACT may include a source area, a drain area, and a channel area disposed between the source area and the drain area.

The active pattern PACT may include an inorganic semiconductor (e.g., amorphous silicon, polysilicon, a metal oxide semiconductor), an organic semiconductor, and the like. These materials may be used alone or in combination with each other.

The metal oxide semiconductor may include a binary compound ("$AB_x$"), a ternary compound ("$AB_xC_y$"), a tetragonal compound ("$AB_xC_yD_z$"), and the like including indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), and indium gallium zinc oxide ("IGZO"). These materials may be used alone or in combination with each other.

The gate insulating layer GI may be disposed on the buffer layer BUF. The gate insulating layer GI may sufficiently cover the active pattern PACT.

For example, the gate insulating layer GI may include inorganic materials such as silicon oxide, silicon nitride, silicon carbide, silicon oxynitride, silicon oxycarbide, or the like. These materials may be used alone or in combination with each other.

The first gate electrode PGE1 may be disposed on the gate insulating layer GI. The first gate electrode PGE1 may overlap the channel area of the active pattern PACT.

The first gate electrode PGE1 may include a metal, an alloy metal nitride, a conductive metal oxide, a transparent conductive material, or the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. These materials may be used alone or in combination with each other.

Examples of the conductive metal oxide may include Indium tin oxide, indium zinc oxide, or the like. These materials may be used alone or in combination with each other.

In addition, examples of the metal nitride may include aluminum nitride ("$AlN_x$"), tungsten nitride ("$WN_x$"), chromium nitride ("$CrN_x$"), or the like. Each of these materials may be used alone or in combination with each other. These materials may be used alone or in combination with each other.

The first interlayer insulating layer ILD1 may be disposed on the gate insulating layer GI. The first interlayer insulating layer ILD1 may sufficiently cover the first gate electrode PGE1.

For example, the first interlayer insulating layer ILD1 may include inorganic materials such as silicon oxide, silicon nitride, silicon carbide, silicon oxynitride, silicon oxycarbide, or the like. These materials may be used alone or in combination with each other.

The second gate electrode PGE2 may be disposed on the first interlayer insulating layer ILD1. The second gate electrode PGE2 may overlap the first gate electrode PGE1 in a plan view. The second gate electrode PGE2 may include the same material as the first gate electrode PGE1.

The second interlayer insulating layer ILD2 may be disposed on the first interlayer insulating layer ILD1. The second interlayer insulating layer ILD2 may sufficiently cover the second gate electrode PGE2.

For example, the second interlayer insulating layer ILD2 may include inorganic materials such as silicon oxide, silicon nitride, silicon carbide, silicon oxynitride, silicon oxycarbide, or the like. These materials may be used alone or in combination with each other.

The source electrode PSE may be disposed on the second interlayer insulating layer ILD2. The source electrode PSE may be connected to the source area of the active pattern PACT through a first contact hole penetrating the gate insulating layer GI, the first interlayer insulating layer ILD1, and the second interlayer insulating layer ILD2.

The drain electrode PDE may be disposed on the second interlayer insulating layer ILD2. The drain electrode PDE may be connected to the drain area of the active pattern PACT through a second contact hole penetrating the gate insulating layer GI, the first interlayer insulating layer ILD1, and the second interlayer insulating layer ILD2.

For example, the source electrode PSE may include a metal, an alloy, a metal nitride, a conductive metal oxide, a transparent conductive material, and the like. These materials may be used alone or in combination with each other. The drain electrode PDE may be formed through the same process as the source electrode PSE, and may include the same material.

The via insulating layer VIA may be disposed on the second interlayer insulating layer ILD2. The via insulating layer VIA may sufficiently cover the source electrode PSE and the drain electrode PDE. In addition, the via insulating layer VIA may have a substantially flat top surface without generating a step around the source electrode PSE and the drain electrode PDE.

The via insulating layer VIA may include organic material. For example, the via insulating layer VIA may include phenolic resin, acrylic resin, polyimide resin, polyamide resin, siloxane resin, epoxy resin, or the like. These materials may be used alone or in combination with each other.

The pixel electrode PE may be disposed on the via insulating layer VIA. The pixel electrode PE may be connected to the drain electrode PDE through a third contact hole penetrating the via insulating layer VIA.

The pixel electrode PE may include a metal, an alloy, a metal nitride, a conductive metal oxide, a transparent conductive material, or the like. These materials be used alone or in combination with each other. In an embodiment, the pixel electrode PE may have a stacked structure including ITO/Ag/ITO. For example, the pixel electrode PE may operate as an anode.

The pixel defining layer PDL may be disposed on the via insulating layer VIA. The pixel defining layer PDL may cover side portions of the pixel electrode PE. In addition, an opening exposing a portion of the upper surface of the pixel electrode PE may be defined in the pixel defining layer PDL.

For example, the pixel defining layer PDL may include an inorganic material or an organic material. In an embodiment, the pixel defining layer PDL may include an organic material such as an epoxy resin, a siloxane resin, or the like. These materials may be used alone or in combination with each other. In another embodiment, the pixel defining layer PDL may further include a light blocking material containing a black pigment, a black dye, and the like.

The light emitting layer EML may be disposed on the pixel electrode PE. The light emitting layer EML may include an organic material that emits light of a predetermined color. For example, the light emitting layer EML may include an organic material that emits red light. However, this disclosure is not limited thereto, and the light emitting layer EML may emit light of a different color from red light.

The common electrode CE may be disposed on the light emitting layer EML and the pixel defining layer PDL. The common electrode CE may include a metal, an alloy, a metal nitride, a conductive metal oxide, a transparent conductive material, or the like. These materials may be used alone or in combination with each other. The common electrode CE may operate as a cathode.

The encapsulation layer TFE may be disposed on the common electrode CE. The encapsulation layer TFE may prevent impurities and moisture from penetrating into the pixel electrode PE, the light emitting layer EML, and the common electrode CE from the outside. The encapsulation layer TFE may include at least one inorganic layer and at least one organic layer.

For example, the inorganic layer may include silicon oxide, silicon nitride, silicon oxynitride, and the like. These materials may be used alone or in combination with each other. The organic layer may include a polymer cured product such as polyacrylate.

Although an exemplary embodiment of the pixel PX has been described with reference to FIG. 3, the pixel PX is not limited to the structure shown in FIG. 3. That is, the pixel PX may include all structures that receive an electrical signal and emit light having a luminance corresponding to the intensity of the electrical signal.

Figure 4:
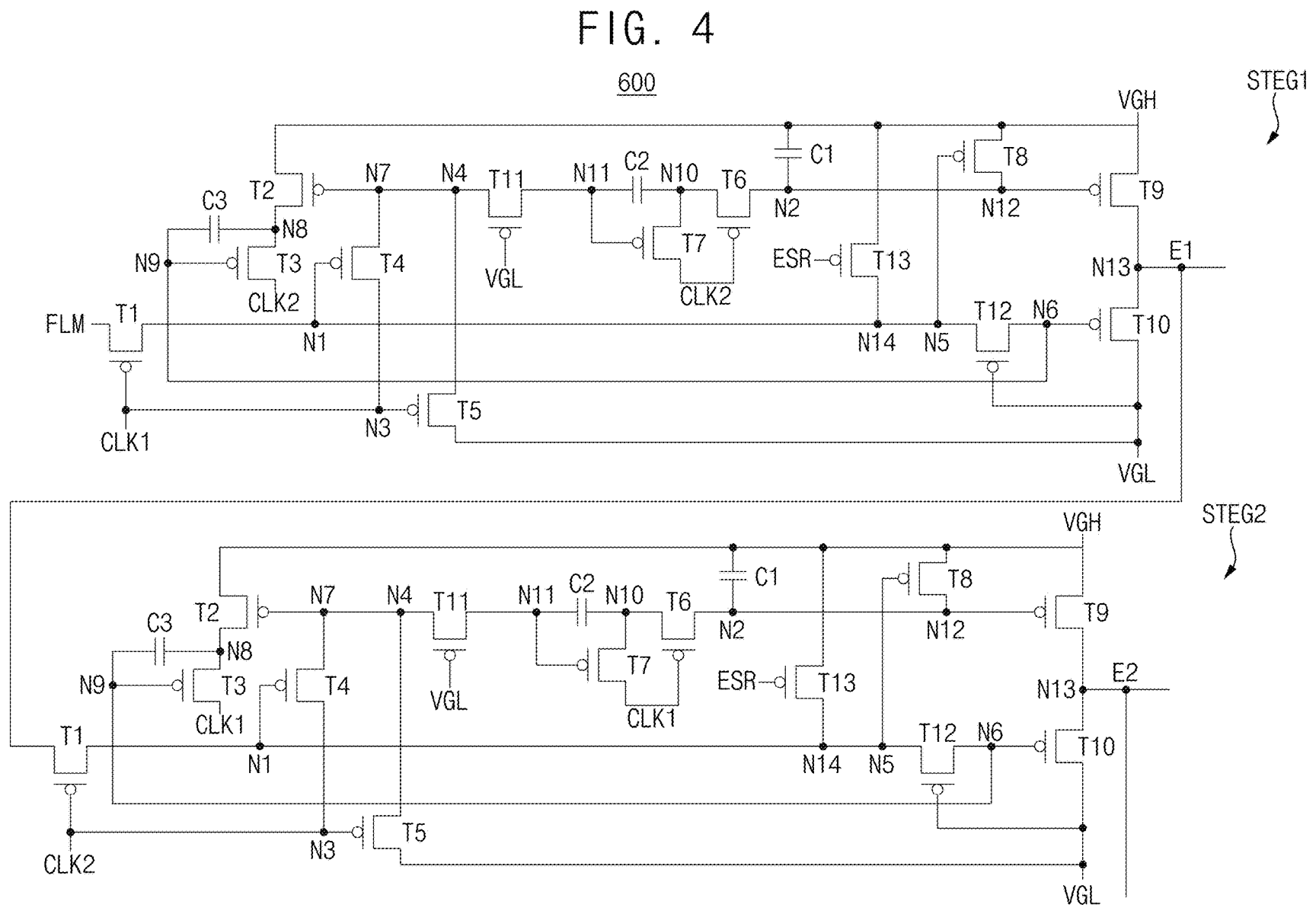

FIG. 4 is a circuit diagram illustrating a light emitting control driver included in the display device of FIG. 2.

Referring to FIGS. 2 and 4, the light emitting control driver 600 may include a plurality of light emitting control stages. For example, the light emitting control driver 600 may include a first light emitting control stage STEG1 and a second light emitting control stage STEG2.

Each of the plurality of light emitting control stages may output a current light emitting control signal based on a previous light emitting control signal output from the previous light emitting control stage. That is, the plurality of light emitting control stages may be configured in a form of a shift register.

For example, the second light emitting control stage STEG2 may output a second light emitting control signal based on a first light emitting control signal output from the first light emitting control stage STEG1. In this case, the first light emitting control signal may be transmitted to each of the plurality of pixels PX11, PX12, . . . , PX1$m$ disposed in the first row through the first light emitting control line E1. In addition, the second light emitting control signal may be transmitted to each of the plurality of pixels PX21, PX22, . . . , PX2$m$ disposed in the second row through the second light emitting control line E2.

However, the first light emitting control stage STEG1 may be driven by receiving a light emitting control start signal FLM.

In addition, a first light emitting control clock line CLK1 and a second light emitting control clock line CLK2 may be sequentially alternately connected to the plurality of light emitting control stages. For example, the first light emitting control stage STEG1 may be connected to the first light emitting control clock line CLK1, and the second light emitting control stage STEG2 may be connected to the second light emitting control clock line CLK2.

As structures of the plurality of light emitting control stages are substantially the same as each other, the first light emitting control stage STEG1 will be described below with reference to FIG. 4.

The first light emitting control stage STEG1 may include a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a twelfth transistor T12, and a thirteenth transistor T13, a first capacitor C1, a second capacitor C2, and a third capacitor C3.

The first transistor T1 may include a first electrode to which the light emitting control start signal FLM is applied, a gate electrode connected to the first light emitting control clock line CLK1, and a second electrode connected to a first node N1. The first transistor T1 may herein be referred to as a "first light emitting control transistor."

The first electrode of the first transistor T1 included in each of the plurality of light emitting control stages except for the first light emitting control stage STEG1 may be connected to a corresponding light emitting control line among the plurality of light emitting control lines E1, E2, . . . , En.

The second transistor T2 may include a first electrode connected to a second power voltage line VGH, a gate electrode connected to a seventh node N7, and a second electrode connected to an eighth node N8.

The third transistor T3 may include a first electrode connected to the eighth node N8, a gate electrode connected to a ninth node N9, and a second electrode connected to the second light emitting control clock line CLK2.

The fourth transistor T4 may include a first electrode connected to the seventh node N7, a gate electrode connected to a first node N1, and a second electrode connected to a third node N3.

The fifth transistor T5 may include a first electrode connected to a fourth node N4, a gate electrode connected to the third node N3, and a second electrode connected to the first power voltage line VGL. The fifth transistor T5 may be referred to as a second light emitting control transistor.

The sixth transistor T6 may include a first electrode connected to a second node N2, a gate electrode connected to the second light emitting control clock line CLK2, and a second electrode connected to a tenth node N10.

The seventh transistor T7 may include a first electrode connected to the tenth node N10, a gate electrode connected to an eleventh node N11, and a second electrode connected to the second light emitting control clock line CLK2.

The eighth transistor T8 may include a first electrode connected to a second power voltage line VGH, a gate electrode connected to a fifth node N5, and a second electrode connected to a twelfth node N12.

The ninth transistor T9 may include a first electrode connected to the second power voltage line VGH, a gate electrode connected to the twelfth node N12, and a second electrode connected to a thirteenth node N13.

The tenth transistor T10 may include a first electrode connected to the thirteenth node N13, a gate electrode connected to the sixth node N6, and a second electrode connected to the first power voltage line VGL.

The eleventh transistor T11 may include a first electrode connected to the eleventh node N11, a gate electrode connected to the first power voltage line VGL, and a second electrode connected to the fourth node N4.

The twelfth transistor T12 may include a first electrode connected to the sixth node N6, a gate electrode connected to the first power voltage line VGL, and a second electrode connected to the fifth node N5. The twelfth transistor T12 may be referred to as a third light emitting control transistor.

The thirteenth transistor T13 may include a first electrode connected to the second power voltage line VGH, a gate electrode to which a light emitting blocking signal line ESR is connected, and a second electrode connected to the fourteenth node N14.

The first capacitor C1 may include a first electrode connected to the second power voltage line VGH and a second electrode connected to the second node N2.

The second capacitor C2 may include a first electrode connected to the tenth node N10 and a second electrode connected to the eleventh node N11.

The third capacitor C3 may include a first electrode connected to the eighth node N8 and a second electrode connected to the ninth node N9.

FIGS. 5, 6, 7, 8, 9, 10, 11, 12, and 13 are layout diagrams illustrating the display device of FIG. 1. Specifically, FIGS. 5, 6, 7, 8, 9, 10, 11, 12, and 13 are layout diagrams illustrating the second light emitting control stage STEG2 of FIG. 4.

Figure 5:
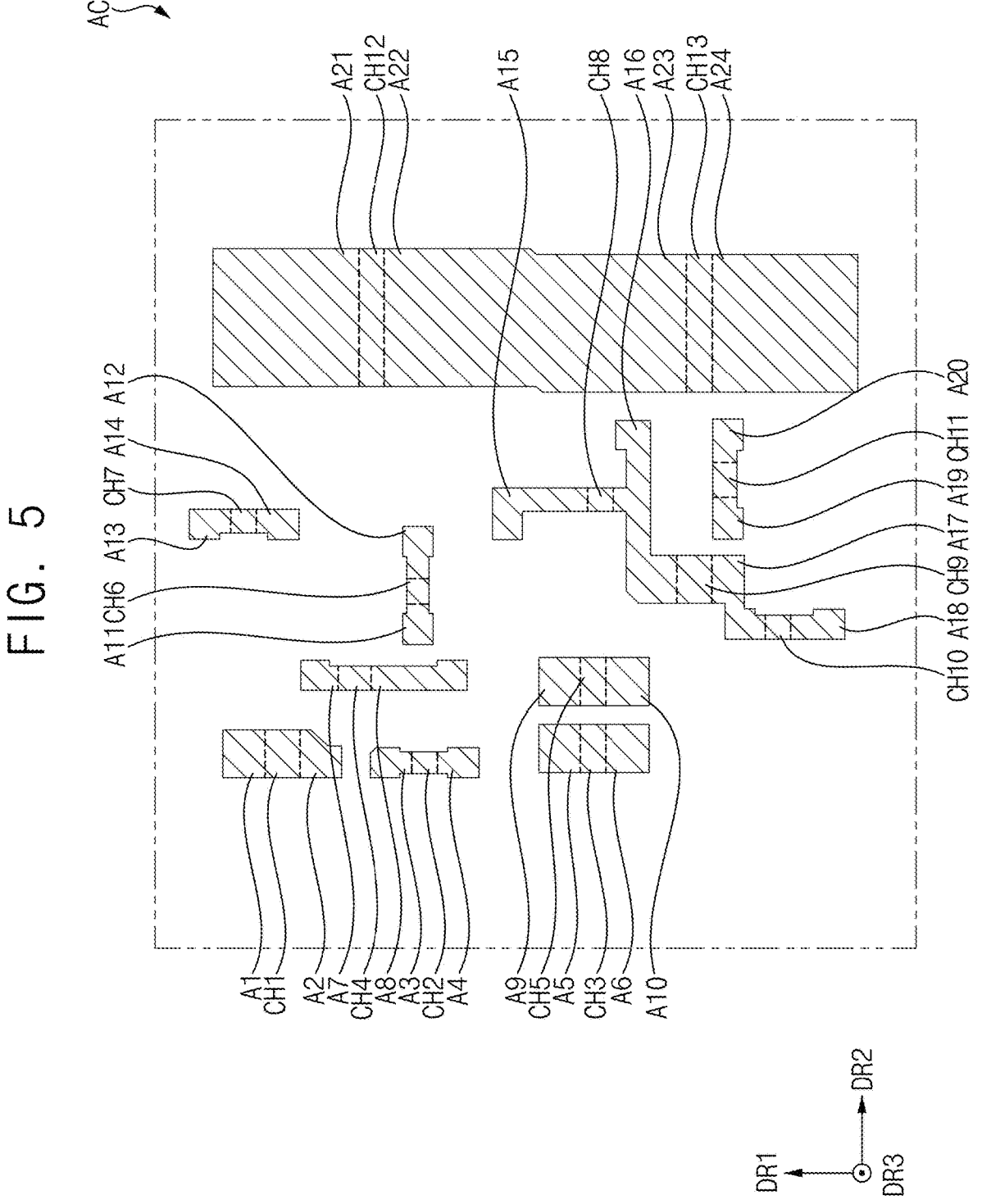

Referring to FIG. 5, a display device (e.g., the display device DD in FIG. 1) may include an active pattern ACT. The active pattern ACT may include a first channel area CH1, a second channel area CH2, a third channel area CH3, a fourth channel area CH4, a fifth channel area CH5, a sixth channel area CH6, a seventh channel area CH7, an eighth channel area CH8, a ninth channel area CH9, a tenth channel area CH10, an eleventh channel area CH11, a twelfth channel area CH12, and a thirteenth channel area CH13, a first area A1, a second area A2, a third area A3, a fourth area A4, a fifth area A5, a sixth area A6, a seventh area A7, an eighth area A8, a ninth area A9, a tenth area A10, an eleventh area A11, a twelfth area A12, a thirteenth area A13, a fourteenth area A14, a fifteenth area A15, a sixteenth area A16, a seventeenth area A17, an eighteenth area A18, a nineteenth area A19, a twentieth area A20, a twenty-first area A21, a twenty-second area A22, a twenty-third area A23, and a twenty-fourth area A24.

The first channel area CH1 may be disposed between the first area A1 and the second area A2. That is, the first area A1 and the second area A2 may be spaced apart from each other. The second channel area CH2 may be disposed between the third area A3 and the fourth area A4. That is, the third area A3 and the fourth area A4 may be spaced apart from each other. The third channel area CH3 may be disposed between the fifth area A5 and the sixth area A6. That is, the fifth area A5 and the sixth area A6 may be spaced apart from each other.

The fourth channel area CH4 may be disposed between the seventh area A7 and the eighth area A8. That is, the seventh area A7 and the eighth area A8 may be spaced apart from each other.

The fifth channel area CH5 may be disposed between the ninth area A9 and the tenth area A10. That is, the ninth area A9 and the tenth area A10 may be spaced apart from each other. The sixth channel area CH6 may be disposed between the eleventh area A11 and the twelfth area A12. That is, the eleventh area A11 and the twelfth area A12 may be spaced apart from each other.

The seventh channel area CH7 may be disposed between the thirteenth area A13 and the fourteenth area A14. That is, the thirteenth area A13 and the fourteenth area A14 may be spaced apart from each other. The eighth channel area CH8 may be disposed between the fifteenth area A15 and the sixteenth area A16. That is, the fifteenth area A15 and the sixteenth area A16 may be spaced apart from each other. The ninth channel area CH9 may be disposed between the sixteenth area A16 and the seventeenth area A17. That is, the sixteenth area A16 and the seventeenth area A17 may be spaced apart from each other.

The tenth channel area CH10 may be disposed between the seventeenth area A17 and the eighteenth area A18. That is, the seventeenth area A17 and the eighteenth area A18 may be spaced apart from each other. The eleventh channel area CH11 may be disposed between the nineteenth area A19 and the twentieth area A20. That is, the nineteenth area A19 and the twentieth area A20 may be spaced apart from each other. The twelfth channel area CH12 may be disposed between the twenty-first area A21 and the twenty-second area A22. That is, the twenty-first area A21 and the twenty-second area A22 may be spaced apart from each other.

The thirteenth channel area CH13 may be disposed between the twenty-third area A23 and the twenty-fourth area A24. That is, the twenty-third area A23 and the twenty-fourth area A24 may be spaced apart from each other.

The active pattern ACT and the active pattern PACT of FIG. 3 may include substantially the same material and may be formed through the same process.

Figure 6:
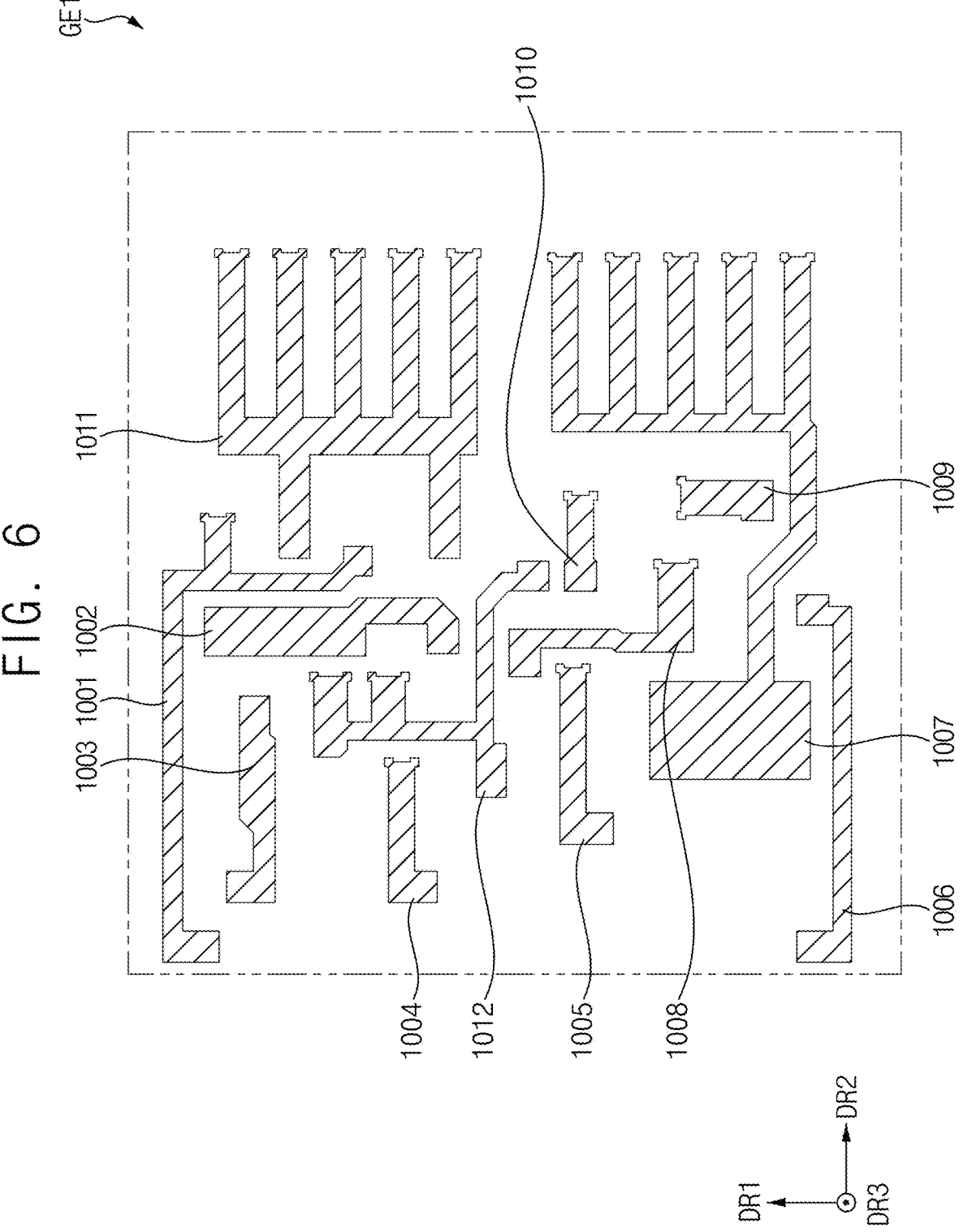
Figure 7:
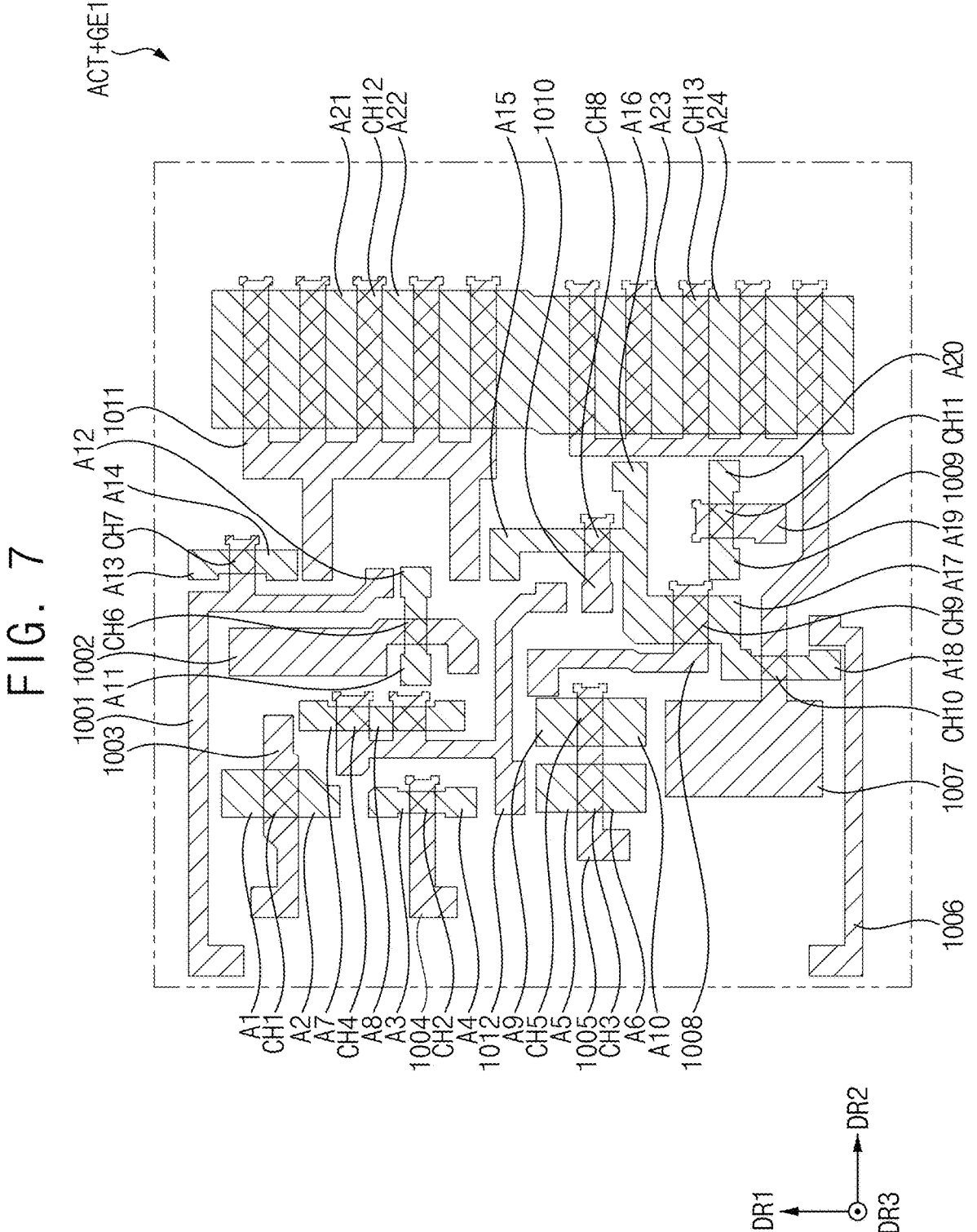

Referring to FIGS. 6 and 7, the first gate electrode GE1 may be disposed on the active pattern ACT. The first gate electrode GE1 and the first gate electrode PGE1 of FIG. 3 may include the same material and may be formed through the same process.

The first gate electrode GE1 may include a first gate pattern 1001, a second gate pattern 1002, a third gate pattern 1003, a fourth gate pattern 1004, a fifth gate pattern 1005, a sixth gate pattern 1006, a seventh gate pattern 1007, an eighth gate pattern 1008, a ninth gate pattern 1009, a tenth gate pattern 1010, an eleventh gate pattern 1011, and a twelfth gate pattern 1012, which are spaced apart from each other.

Figure 8:
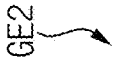
Figure 8:
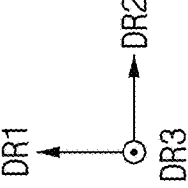
Figure 9:
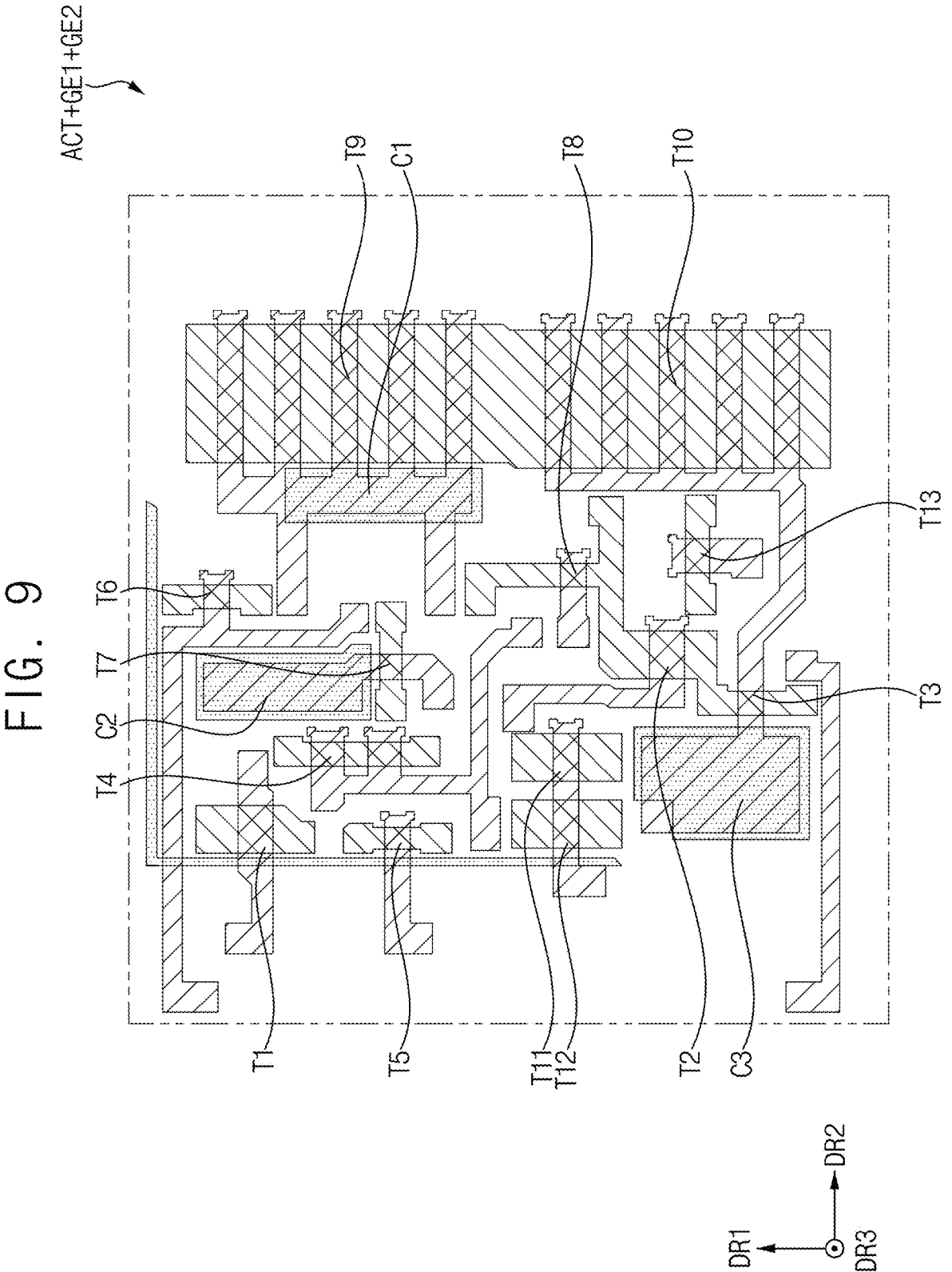

Referring to FIGS. 8 and 9, the second gate electrode GE2 may be disposed on the first gate electrode GE1. The second gate electrode GE2 may include a 2-1 sub-gate electrode SGE1, a 2-2 sub-gate electrode SGE2, a 2-3 sub-gate electrode SGE3, and a 2-4 sub-gate electrode SGE4.

The second gate electrode GE2 and the second gate electrode PGE2 of FIG. 3 may include substantially the same material and may be formed through the same process.

A 2-1 sub-gate electrode SGE1, a 2-2 sub-gate electrode SGE2, a 2-3 sub-gate electrode SGE3, and a 2-4 sub-gate electrode SGE4 may be spaced apart from each other.

The 2-1 sub-gate electrode SGE1 may include a first portion SGA and a second portion SGB. The first portion SGA may extend in the first direction DR1. In addition, the second portion SGB may extend in the second direction DR2.

The first transistor T1 may include at least a portion of the active pattern ACT (i.e., a portion of the first channel area CH1, the first area A1 and the second area A2), and a portion of the third gate pattern 1003 overlapping the first channel area CH1 of the active pattern ACT.

The second transistor T2 may include at least a portion of the active pattern ACT (i.e., a portion of the ninth channel area CH9, the sixteenth area A16, and the seventeenth area A17), and a portion of the eighth gate pattern 1008 overlapping the ninth channel area CH9 of the active pattern ACT.

The third transistor T3 may include at least a portion of the active pattern ACT (i.e., a portion of the tenth channel area CH10, the seventeenth area A17, and the eighteenth area A18), and a portion of the seventh gate pattern 1007 overlapping the tenth channel area CH10 of the active pattern ACT.

The fourth transistor T4 may include at least a portion of the active pattern ACT (i.e., a portion of the fourth channel area CH4, the seventh area A7, and the eighth area A8) and a portion of the twelfth gate pattern 1012 overlapping the fourth channel area CH4 of the active pattern ACT.

The fifth transistor T5 may include at least a portion of the active pattern ACT (i.e., a portion of the second channel area CH2, the third area A3, and the fourth area A4) and a portion of the fourth gate pattern 1004 overlapping the second channel area CH2 of the active pattern ACT.

The sixth transistor T6 may include at least a portion of the active pattern ACT (i.e., a portion of the seventh channel area CH7, the thirteenth area A13, and the fourteenth area A14), and a portion of the first gate pattern 1001 overlapping the seventh channel area CH7 of the active pattern ACT.

The seventh transistor T7 may include at least a portion of the active pattern ACT (i.e., a portion of the sixth channel area CH6, the eleventh area A11, and the twelfth area A12), and a portion of the second gate pattern 1002 overlapping the sixth channel area CH6 of the active pattern ACT.

The eighth transistor T8 may include at least a portion of the active pattern ACT (i.e., a portion of the eighth channel area CH8, the fifteenth area A15 and the sixteenth area A16), and a portion of the tenth gate pattern 1010 overlapping the eighth channel area CH8 of the active pattern ACT.

The ninth transistor T9 may include at least a portion of the active pattern ACT (i.e., a portion of the twelfth channel area CH12, the twenty-first area A21, and the twenty-second area A22), and a portion of the eleventh gate pattern 1011 overlapping the twelfth channel area CH12 of the active pattern ACT.

The tenth transistor T10 may include at least a portion of the active pattern ACT (i.e., a portion of the thirteenth channel area CH13, the twenty-third area A23, and the twenty-fourth area A24), and a portion of the seventh gate pattern 1007 overlapping the thirteenth channel area CH13 of the active pattern ACT.

The eleventh transistor T11 may include at least a portion of the active pattern ACT (i.e., a portion of the fifth channel area CH5, the ninth area A9, and the tenth area A10) and a portion of the fifth gate pattern 1005 overlapping the fifth channel area CH5 of the active pattern ACT.

The twelfth transistor T12 may include at least a portion of the active pattern ACT (i.e., a portion of the third channel area CH3, the fifth area A5, and the sixth area A6) and a portion of the fifth gate pattern 1005 overlapping the third channel area CH3 of the active pattern ACT.

The thirteenth transistor T13 may include at least a portion of the active pattern ACT (i.e., a portion of the eleventh channel area CH11, the nineteenth area A19, and the twentieth area A20), and a portion of the ninth gate pattern 1009 overlapping the eleventh channel area CH11 of the active pattern ACT.

The first capacitor C1 may include the 2-3 sub-gate electrode SGE3 and a portion of the eleventh gate pattern 1011 overlapping the 2-3 sub-gate electrode SGE3. The 2-3 sub-gate electrode SGE3 may be the first electrode of the first capacitor C1 of FIG. 4.

The second capacitor C2 may include the 2-2 sub-gate electrode SGE2 and a portion of the second gate pattern 1002 overlapping the 2-2 sub-gate electrode SGE2.

The third capacitor C3 may include a portion of the 2-4 sub-gate electrode SGE4 and a portion of the seventh gate pattern 1007 overlapping the 2-4 sub-gate electrode SGE4.

Figure 10:
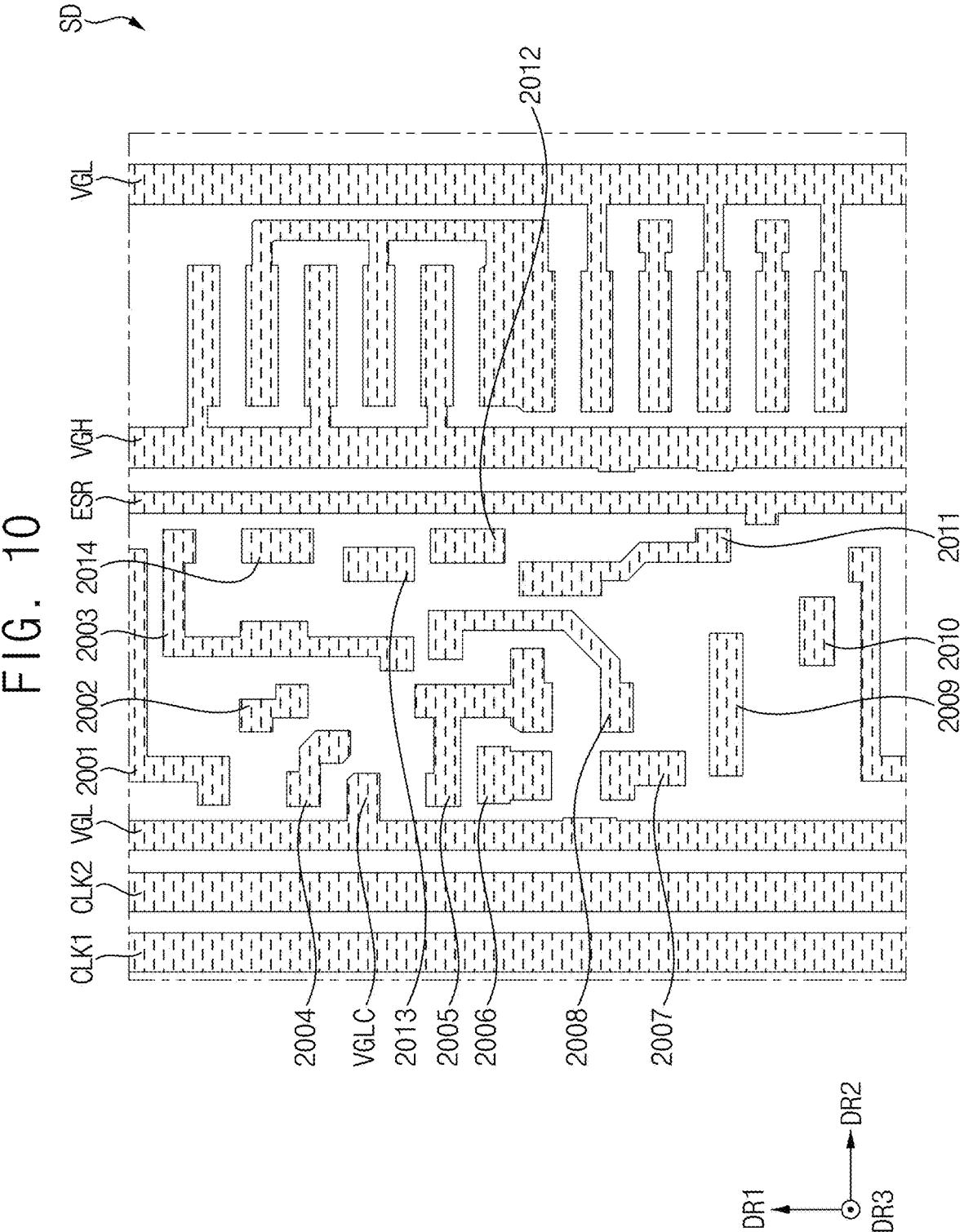
Figure 11:
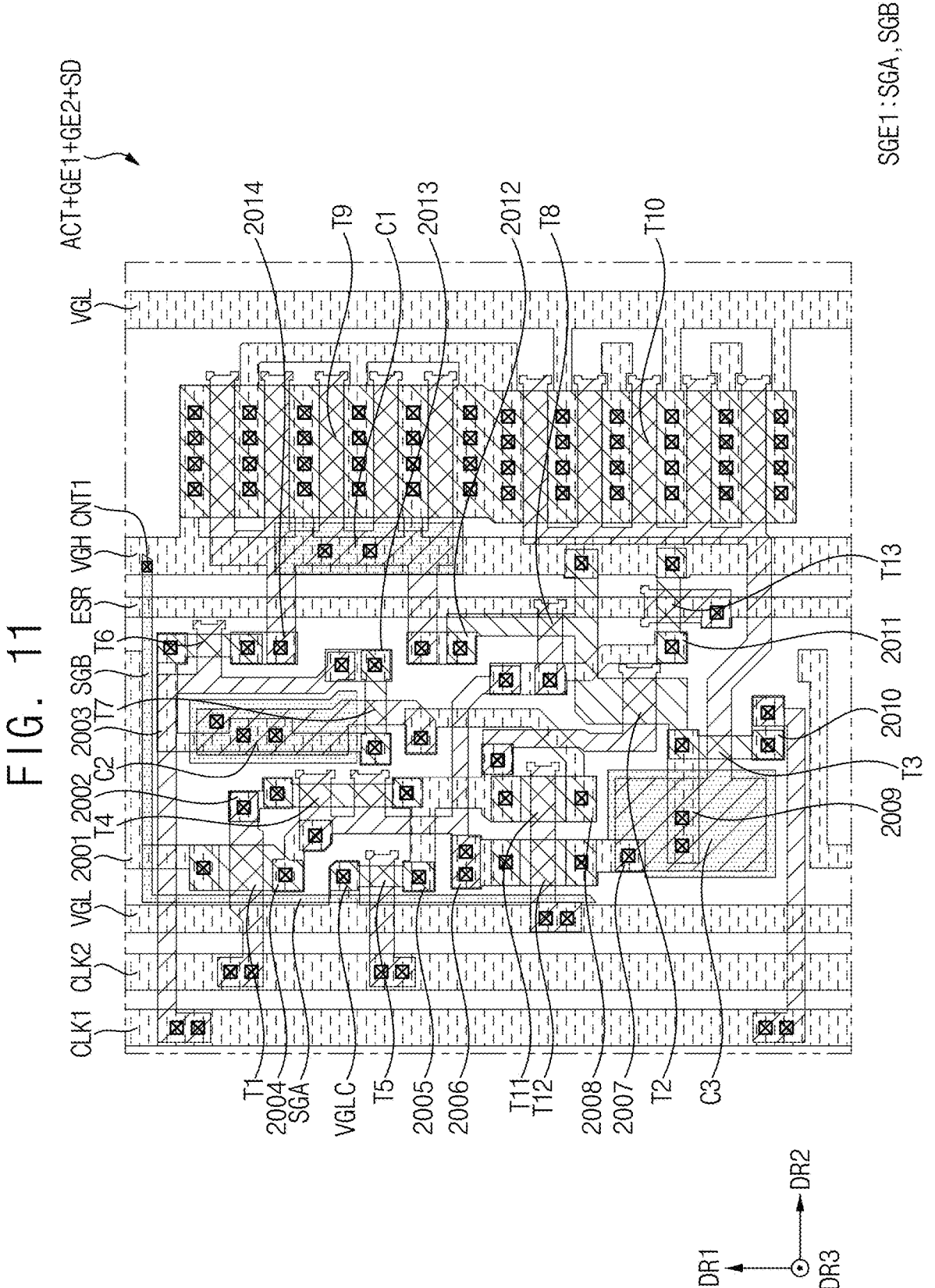

Referring to FIGS. 9 and 10, Source electrodes SD may be disposed on the second gate electrode GE2.

The source electrodes SD may include a first light emitting control clock line CLK1, a second light emitting control clock line CLK2, a first power voltage line VGL, a connection line VGLC, a light emitting blocking signal line ESR, a second power voltage line VGH, a first source pattern 2001, a second source pattern 2002, a third source pattern 2003, a fourth source pattern 2004, a fifth source pattern 2005, a sixth source pattern 2006, a seventh source pattern 2007, an eighth source pattern 2008, a ninth source pattern 2009, a tenth source pattern 2010, an eleventh source pattern 2011, a twelfth source pattern 2012, a thirteenth source pattern 2013 and a fourteenth source pattern 2014.

The source electrodes SD, the source electrode PSE and the drain electrode PDE of FIG. 3 may include substantially the same material and may be formed through the same process.

A first light emitting control clock signal may be applied to the first light emitting control clock line CLK1. The first light emitting control clock line CLK1 may extend in the first direction DR1. A second light emitting control clock signal may be applied to the second light emitting control clock line CLK2. The second light emitting control clock line CLK2 may extend in the first direction DR1.

A first power voltage may be applied to the first power voltage line VGL. The first power voltage line VGL may extend in the first direction DR1.

The connection line VGLC may be connected to the first power voltage line VGL. Also, the connection line VGLC may extend in the second direction DR2.

A second power voltage may be applied to the second power voltage line VGH. The second power voltage line VGH may extend in the first direction DR1.

The second power voltage may be a voltage higher than the first power voltage. For example, the first power voltage may be a negative voltage, and the second power voltage may be a positive voltage.

Alight emitting blocking signal may be applied to the light emitting blocking signal line ESR. The light emitting blocking signal line ESR may extend in the first direction DR1.

Referring to FIGS. 5, 6, 8 and 11, the second light emitting control clock signal applied through the second light emitting control clock line CLK2 may be applied to the gate electrode of the first transistor T1. Furthermore, the second light emitting control clock signal may be applied to the gate electrode of the fifth transistor T5.

The first power voltage applied through the first power voltage line VGL may be applied to the third area A3 of the fifth transistor T5 through the connection line VGLC. Also, the first power voltage may be applied to the gate electrode of the twelfth transistor T12.

The first source pattern 2001 may be connected to the first area A1 of the active pattern ACT. The second source pattern 2002 may be connected to the third gate pattern 1003 and the seventh area A7. The third source pattern 2003 may be connected to the thirteenth area A13, the second gate pattern 1002, and the eleventh area A11.

The fourth source pattern 2004 may be connected to the second area A2 and the twelfth gate pattern 1012. The fifth source pattern 2005 may be connected to the fourth area A4, the eighth area A8, the ninth area A9, and the eighth gate pattern 1008. The sixth source pattern 2006 may be connected to the twelfth gate pattern 1012 and the fifth area A5.

The seventh source pattern 2007 may be connected to the sixth area A6 and the seventh gate pattern 1007. The eighth source pattern 2008 may be connected to the tenth area A10 and the second gate pattern 1002. The ninth source pattern 2009 may be connected to the seventh gate pattern 1007 and the seventeenth area A17.

The tenth source pattern 2010 may be connected to the eighteenth area A18 and the sixth gate pattern 1006. The eleventh source pattern 2011 may be connected to the twelfth gate pattern 1012, the tenth gate pattern 1010, and the nineteenth area A19. The twelfth source pattern 2012 may be connected to the fifteenth area A15 and the eleventh gate pattern 1011.

The thirteenth source pattern 2013 may be connected to the twelfth area A12 and the first gate pattern 1001. The fourteenth source pattern 2014 may be connected to the fourteenth area A14 and the eleventh gate pattern 1011.

Contact holes may be formed for connecting patterns on different electrode layers. For example, the first contact hole CNT1 may connect the 2-1 sub-gate electrode SGE1 and the second power voltage line VGH. Specifically, the second portion SGB of the 2-1 sub-gate electrode SGE1 may be connected to the second power voltage line VGH through the first contact hole CNT1.

In an embodiment, the first portion SGA of the 2-1 sub-gate electrode SGE1 may extend to be disposed between the first transistor T1 and the first power voltage line VGL. In addition, the first portion SGA may be extended to be disposed between the fifth transistor T5 and the first power voltage line VGL. In addition, the first portion SGA may be extended to be disposed between the twelfth transistor T12 and the first power voltage line VGL. The 2-1 sub-gate electrode SGE1 may herein be referred to as a "shielding pattern."

In an embodiment, the second portion SGB of the 2-1 sub-gate electrode SGE1 may partially overlap the first source pattern 2001. Also, the second portion SGB may partially overlap the light emitting blocking signal line ESR.

Figure 12:
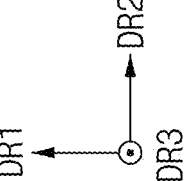
Figure 13:
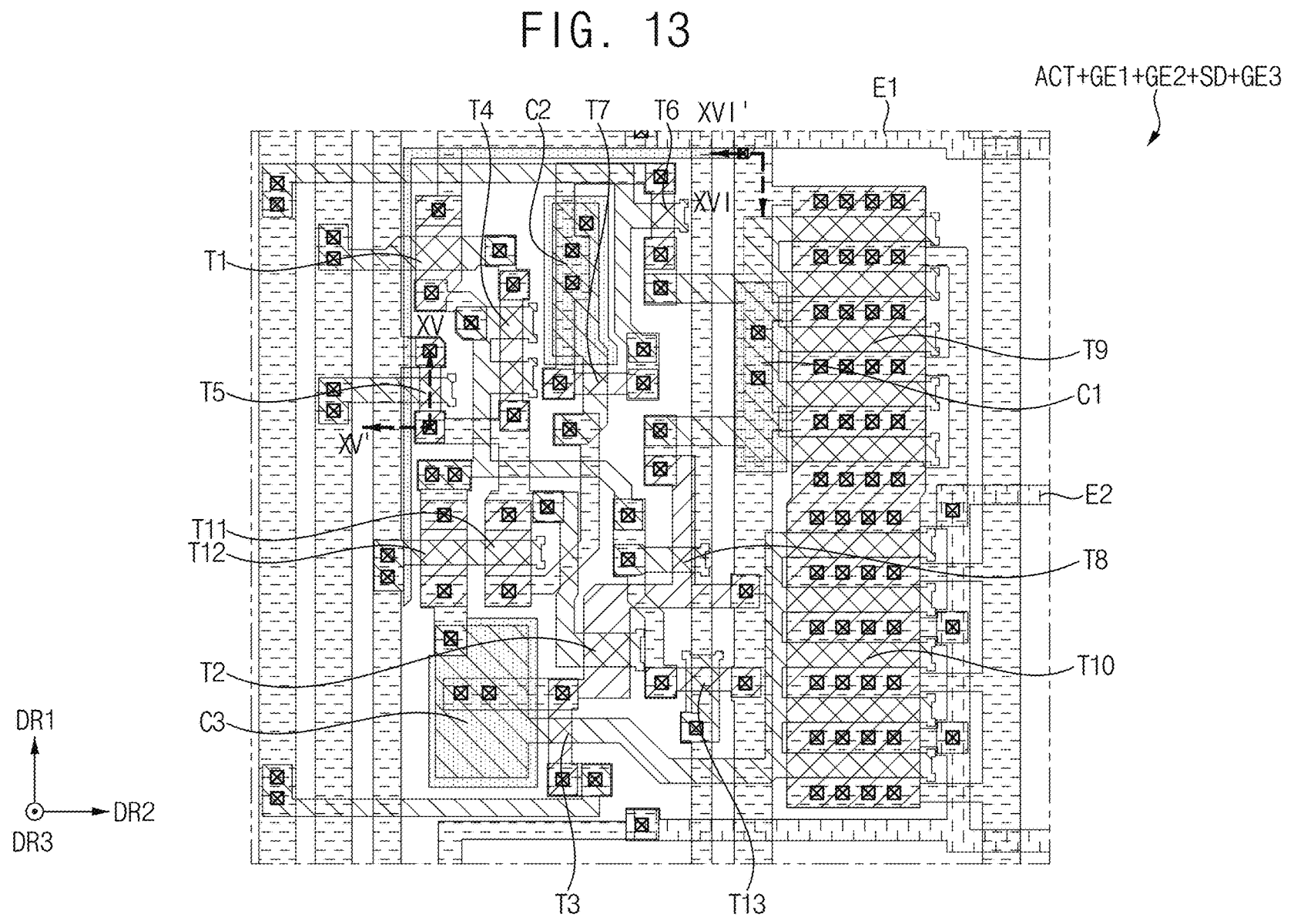

Referring to FIGS. 12 and 13, in an embodiment, a third gate electrode GE3 may be disposed on the source electrodes SD. The third gate electrode GE3 may include a first light emitting control line E1 and a second light emitting control line E2.

The first light emitting control line E1 may be connected to the first electrode of the first transistor T1 in the second light emitting control stage STEG2. The first light emitting control line E1 may transmit the first light emitting control signal to the first electrode of the first transistor T1.

In the second light emitting control stage STEG2, the second light emitting control line E2 may be connected to the second electrode of the ninth transistor T9 through a thirteenth node (e.g., the thirteenth node N13 of FIG. 4). In addition, the second light emitting control line E2 may be connected to the first electrode of the tenth transistor T10 through the thirteenth node.

The second light emitting control line E2 may transmit the second light emitting control signal to each of a plurality of pixels disposed in the second row (e.g., the plurality of pixels PX21, PX22, . . . , PX2m disposed in the second row of FIG. 2). In addition, the second light emitting control line E2 may transmit the second light emitting control signal to a third light emitting control stage adjacent to a second light emitting control stage (e.g., the second light emitting control stage STEG2 in FIG. 4) in a direction opposite the coordinate arrow of the first direction DR1.

Figure 14:
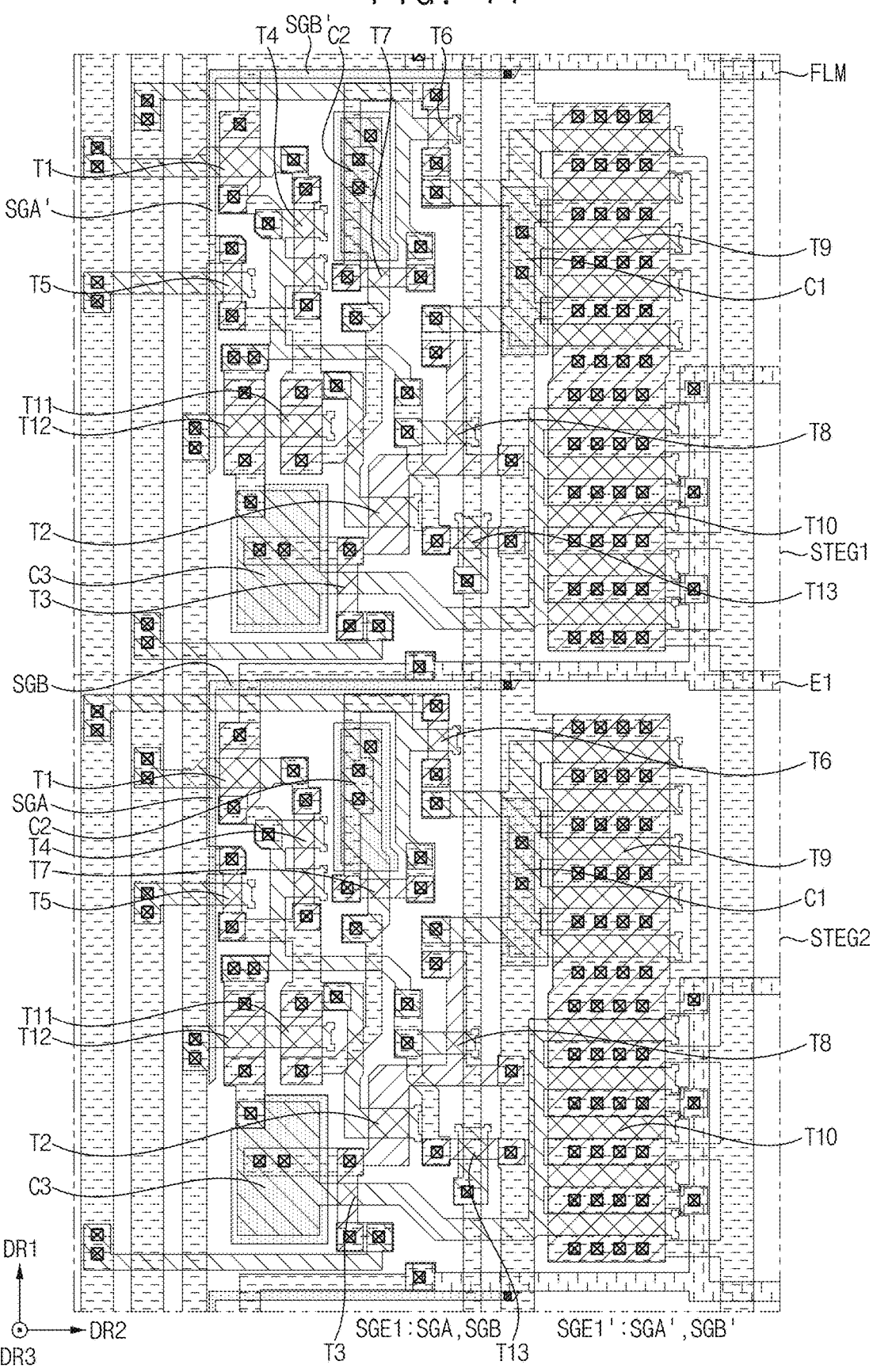
FIG. 14 is a layout diagram illustrating a first light emitting control stage and a second light emitting control stage of FIG. 4.

FIG. 14 is a layout diagram illustrating a first light emitting control stage and a second light emitting control stage of FIG. 4.

Referring to FIG. 14, a 2-1 sub-gate electrode SGE1' included in the first light emitting control stage STEG1 may include a first portion SGA' and a second portion SGB'. In an embodiment, 2-1 sub-gate electrodes included in each of the plurality of light emitting control stages may not be connected to each other. For example, the 2-1 sub-gate electrode SGE1' included in the first light emitting control stage STEG1 may not be connected to the 2-1 sub-gate electrode SGE1 included in the second light emitting control stage STEG2. For example, the first portion SGA' of the 2-1 sub-gate electrode SGE1' included in the first light emitting control stage STEG1 may not be connected to the first portion SGA of the 2-1 sub-gate electrode SGE1 included in the second light emitting control stage STEG2.

That is, the 2-1 sub-gate electrode included in each of the plurality of light emitting control stages may include a first portion extending in the first direction DR1 and a second portion extending in the second direction DR2.

Figure 15:
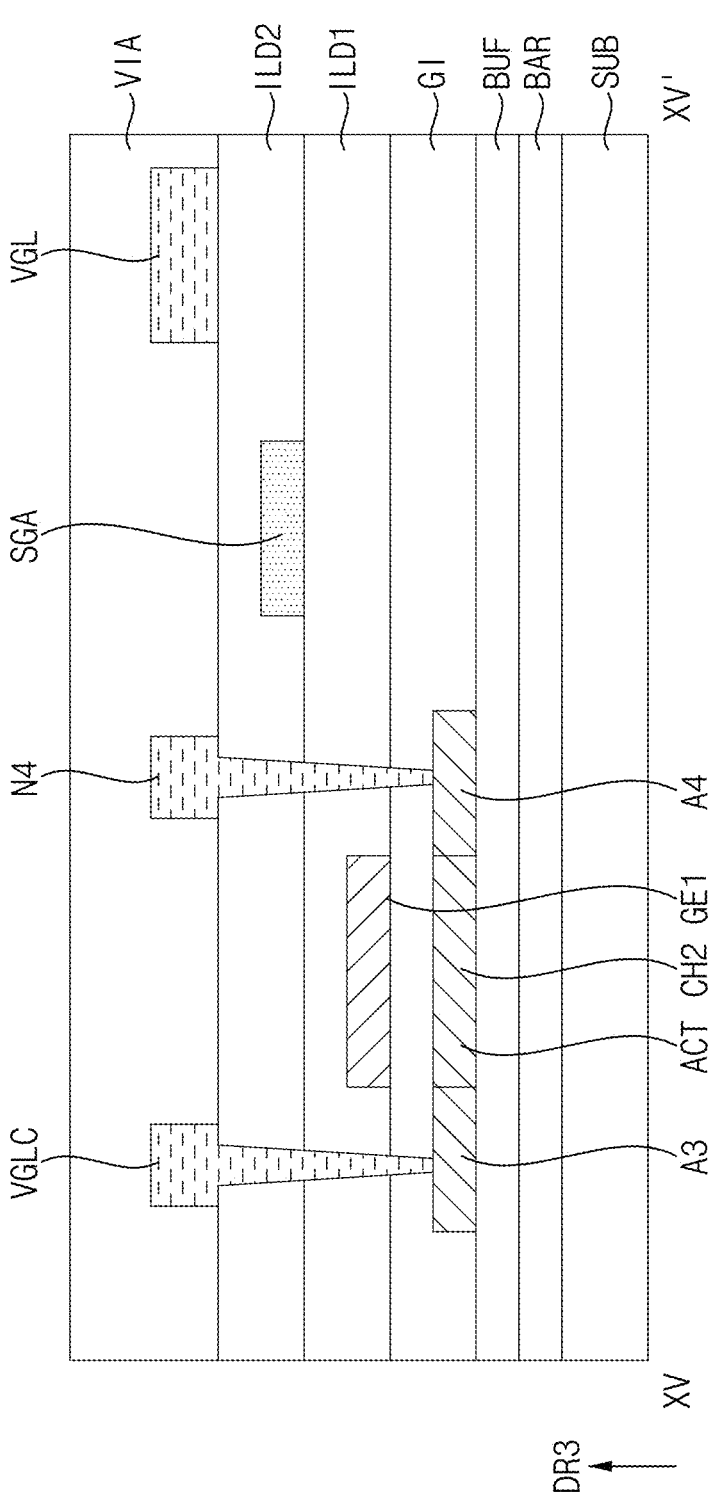
FIG. 15 is a cross-sectional view taken along line XV-XV' of FIG. 13.

FIG. 15 is a cross-sectional view taken along line XV-XV' of FIG. 13 from the view direction shown by the dotted line and arrow.

In describing of FIG. 15, the same reference numerals are assigned to components as those of FIG. 3, and a detailed description of the same components may be omitted.

Referring to FIGS. 13 and 15, a light emitting control driver (e.g., the light emitting control driver 600 of FIG. 2) may include a substrate SUB, a barrier layer BAR, a buffer layer BUF, a gate insulating layer GI, a first interlayer insulating layer ILD1, a second interlayer insulating layer ILD2, a via insulating layer VIA, an active pattern ACT, a first gate electrode GE1, a first power voltage line VGL, a fourth node N4, a connection line VGLC, and a first portion SGA of a 2-1 sub-gate electrode (e.g., the 2-1 sub-gate electrode SGE1 of FIG. 8).

The active pattern ACT may be disposed on the buffer layer BUF. The active pattern ACT may include a second channel area CH2, a third area A3, and a fourth area A4.

The gate insulating layer GI may be disposed on the buffer layer BUF. The gate insulating layer GI may sufficiently cover the active pattern ACT.

The first gate electrode GE1 may be disposed on the gate insulating layer GI. The first gate electrode GE1 may overlap the second channel area CH2. In this case, the fifth transistor T5 may include the active pattern ACT and the first gate electrode GE1 overlapping the second channel area CH2 of the active pattern ACT.

The first interlayer insulating layer ILD1 may be disposed on the gate insulating layer GI. The first interlayer insulating layer ILD1 may sufficiently cover the first gate electrode GE1.

The first portion SGA of the 2-1 sub-gate electrode may be disposed on the first interlayer insulating layer ILD1. The first portion SGA may be disposed between the fifth transistor T5 and the first power voltage line VGL.

The second interlayer insulating layer ILD2 may be disposed on the first interlayer insulating layer ILD1. The second interlayer insulating layer ILD2 may sufficiently cover the first portion SGA.

The connection line VGLC, the fourth node N4, and the first power voltage line VGL may be disposed on the second interlayer insulating layer ILD2. The connection line VGLC may be connected to the third area A3 of the active pattern ACT through a contact hole. In addition, the fourth node N4 may be connected to the fourth area A4 of the active pattern ACT. The fourth node N4 may be substantially the same configuration as the fourth node N4 of FIG. 4.

The via insulating layer VIA may be disposed on the second interlayer insulating layer ILD2. The via insulation layer VIA may sufficiently cover the connection line VGLC, the fourth node N4, and the first power voltage line VGL. In addition, the via insulating layer VIA may have a substantially flat top surface without generating a step around the connection line VGLC, the fourth node N4, and the first power voltage line VGL.

Figure 16:
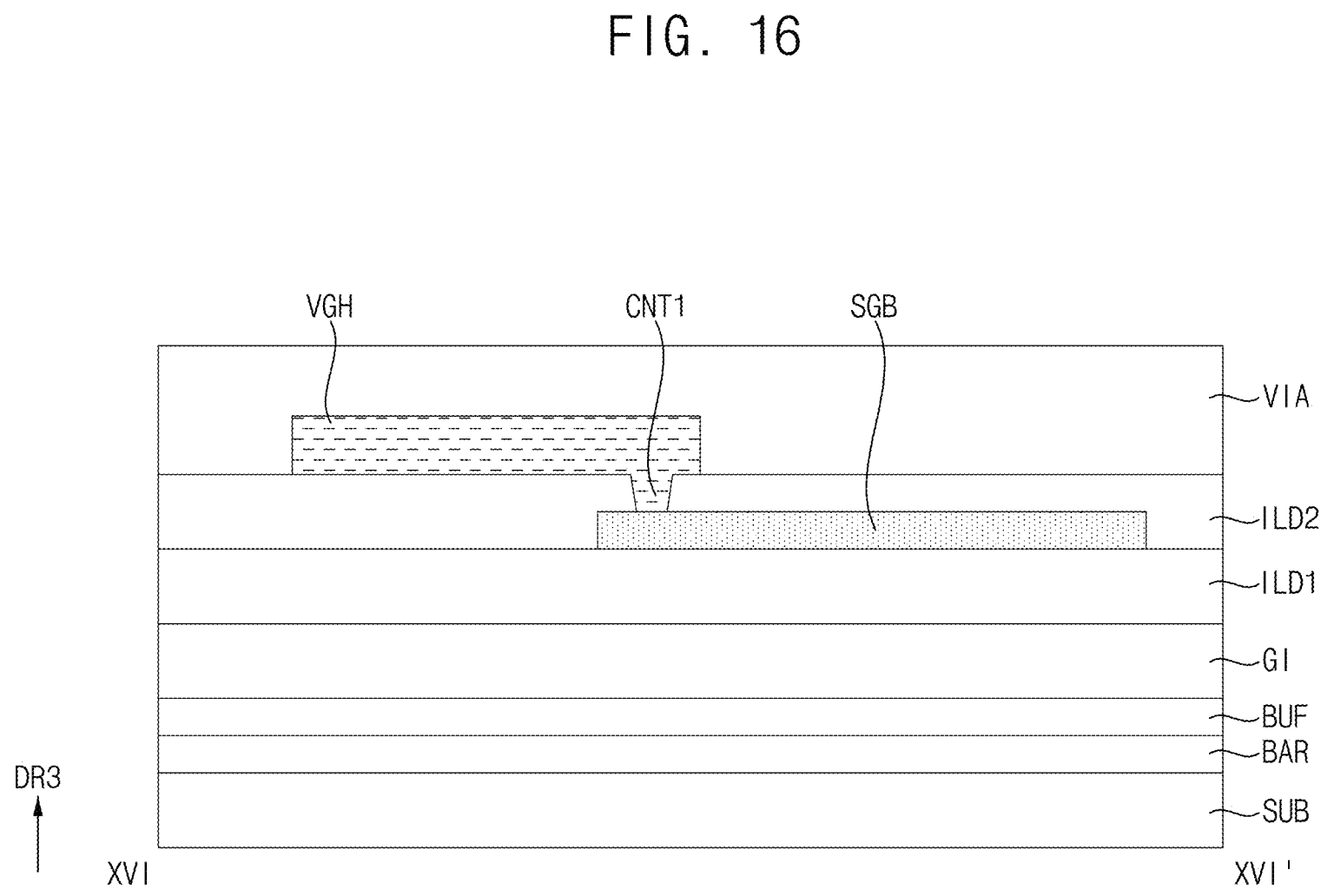

FIG. 16 is a cross-sectional view taken along line XVI-XVI' of FIG. 13 from the view direction shown by the dotted line and arrow.

Referring to FIGS. 13 and 16, the second portion SGB of the 2-1 sub-gate electrode (e.g., the 2-1 sub-gate electrode SGE1 of FIG. 8) may be disposed on the first interlayer insulating layer ILD1. Also, the second power voltage line VGH may be disposed on the second interlayer insulating layer ILD2.

The second power voltage line VGH and the second portion SGB may be connected to each other through a first contact hole CNT1. Accordingly, the second power voltage applied through the second power voltage line VGH may be applied to the second portion SGB.

Referring to FIGS. 13, 15, and 16, as mentioned above, the first power voltage may be applied to the first power voltage line VGL. The first power voltage may be a negative voltage. Accordingly, positive charges may accumulate on an upper portion of the substrate SUB. That is, when a negative voltage is applied to the first power voltage line VGL, positive charges may be accumulated on the upper portion of the substrate SUB.

In this case, positive charges may accumulate not only on the upper portion of the substrate SUB overlapping the first power voltage line VGL, but also on an upper portion of the substrate SUB overlapping the active pattern ACT. Therefore, an electric field may be generated under the active pattern ACT.

Accordingly, a threshold voltage of each of the first transistor T1, the fifth transistor T5, and the twelfth transistor T12 adjacent to the first power voltage line VGL may be shifted. Specifically, the threshold voltage of each of the first transistor T1, the fifth transistor T5, and the twelfth transistor T12 may be negatively shifted. Accordingly, an output of the light emitting control signal such as the second light emitting control signal may be lowered.

Each of the light emitting control stages according to an embodiment may include a 2-1 sub-gate electrode SGE1. The 2-1 sub-gate electrode SGE1 may include a first portion SGA and a second portion SGB.

The first portion SGA may extend to be disposed between the first transistor T1 and the first power voltage line VGL. In addition, the first portion SGA may extend to be disposed between the fifth transistor T5 and the first power voltage line VGL. In addition, the first portion SGA may extend to be disposed between the twelfth transistor T12 and the first power voltage line VGL.

The second portion SGB may be connected to the second power voltage line VGH through a first contact hole CNT1. Accordingly, the second power voltage may be applied to the first portion SGA through the second portion SGB. As mentioned above, the second power voltage may be a positive voltage, and accordingly, a positive voltage may be applied to the first portion SGA.

Therefore, negative charges may accumulate on an upper portion of the substrate SUB overlapping the first portion SGA. Positive charges may be prevented from accumulating on the upper portion of the substrate SUB overlapping the active pattern ACT.

Accordingly, a negative shift of the threshold voltage of each of the first transistor T1, the fifth transistor T5, and the twelfth transistor T12 may be prevented. Accordingly, the output of the light emitting control signal such as the second light emitting control signal may not be lowered.

In addition, by placing a lower metal under the active pattern ACT, the accumulation of positive charges on the upper portion of the substrate SUB by the first power voltage line VGL may be prevented. In this case, an additional process and a mask may be required to arrange the lower metal.

According to an embodiment, as the 2-1 sub-gate electrode SGE1 is disposed, the threshold voltage of each of the first transistor T1, the fifth transistor T5, and the twelfth transistor T12 may be prevented from being negatively shifted without the lower metal. That is, the threshold voltage of each of the first transistor T1, the fifth transistor T5, and the twelfth transistor T12 may be prevented from being negatively shifted without an additional process and mask.

FIGS. 8, 11, 13, 14, and 15 may illustrate an example in which the shielding pattern is a portion of the second gate electrode GE2. However, this disclosure is not limited thereto.

For example, the shielding pattern may be a portion of the source electrodes SD. In this case, the shielding pattern may be a portion of the second power voltage line VGH. That is, the second power voltage line VGH may extend to be disposed between the first transistor T1 and the first power voltage line VGL. In addition, the second power voltage line VGH may be extended to be disposed between the fifth transistor T5 and the first power voltage line VGL. In addition, the second power voltage line VGH may be extended to be disposed between the twelfth transistor T12 and the first power voltage line VGL. Accordingly, the threshold voltage of each of the first transistor T1, the fifth transistor T5, and the twelfth transistor T12 may be prevented from being negatively shifted.

For example, the shielding pattern may be a portion of the first gate electrode GE1. In this case, the first gate electrode GE1 may be disposed between the first transistor T1 and the first power voltage line VGL. In addition, the first gate electrode GE1 may be extended to be disposed between the fifth transistor T5 and the first power voltage line VGL. In addition, the first gate electrode GE1 may be disposed between the twelfth transistor T12 and the first power voltage line VGL. In addition, the first gate electrode GE1 may be connected to the second power voltage line VGH through a contact hole. Accordingly, a negative shifting of the threshold voltage of each of the first transistor T1, the fifth transistor T5, and the twelfth transistor T12 may be prevented.

That is, a position of the shielding pattern may be varied according to this disclosure.

Figure 17:
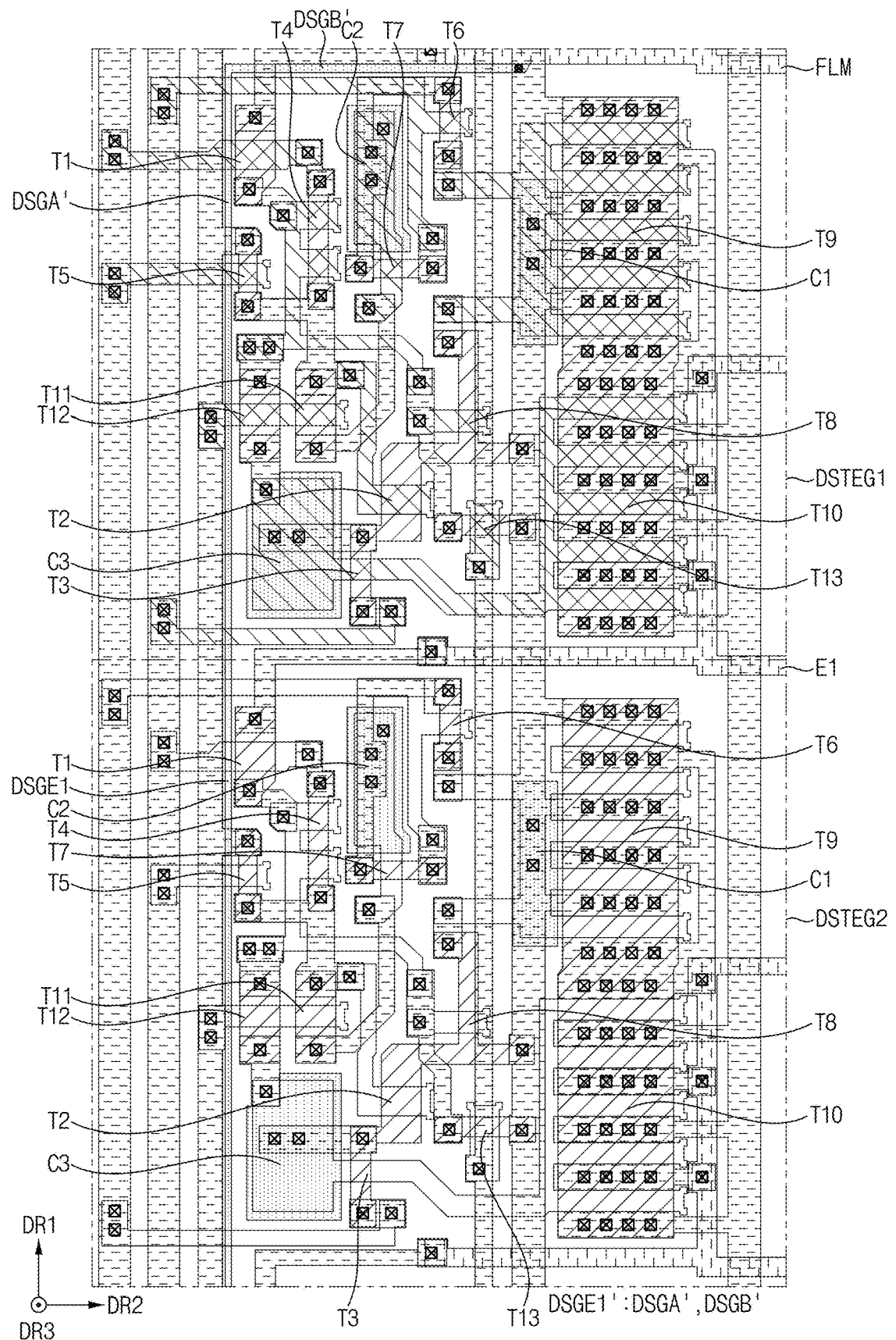
FIG. 17 is a layout diagram illustrating a first light emitting control stage and a second light emitting control stage according to another embodiment.

FIG. 17 is a layout diagram illustrating a first light emitting control stage and a second light emitting control stage according to another embodiment.

The first light emitting control stage DSTEG1 of FIG. 17 may be substantially the same as the first light emitting control stage STEG1 of FIG. 14 except for a configuration of the 2-1 sub-gate electrode DSGE1'. In addition, the second light emitting control stage DSTEG2 of FIG. 17 may be substantially the same as the second light emitting control stage STEG2 of FIG. 14 except for a configuration of the 2-1 sub-gate electrode DSGE1.

Referring to FIG. 17, 2-1 sub-gate electrodes included in each of the plurality of light emitting control stages may be connected to each other. That is, the 2-1 sub-gate electrode included in each of the plurality of light emitting control stages may be integrally formed.

For example, a 2-1 sub-gate electrode DSGE1' included in the first light emitting control stage DSTEG1 may include a first portion DSGA' extending in the first direction DR1 and a second portion DSGB' extending in the second direction DR2. In addition, the 2-1 sub-gate electrode DSGE1 included in the second light emitting control stage DSTGE2 may include only a portion extending in the first direction DR1.

The 2-1 sub-gate electrode DSGE1 of the second light emitting control stage DSTEG2 may be a portion extending from the first portion DSGA' of the first light emitting control stage DSTEG1.

That is, a 2-1 sub-gate electrode included in each of the plurality of light emitting control stages except for the first light emitting control stage DSTEG1 may include only a portion extending in the first direction DR1, and not the portion extending in the second direction DR2.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
 a display panel containing pixels connected to a light emitting control line; and
 a light emitting control driver including a light emitting control stage that provides a light emitting control signal to the pixels through the light emitting control line,
 wherein the light emitting control stage includes:
  a first light emitting control transistor including a first electrode configured to receive a light emitting control signal, a gate electrode connected to a first light emitting control clock line, and a second electrode connected to a first node;
  a first power voltage line to which a first power voltage is applied; and
  a shielding pattern disposed between the first light emitting control transistor and the first power voltage line in a layout view and receiving a power voltage higher than the first power voltage.

2. The display device of claim 1, wherein the light emitting control stage further includes a second power voltage line to which a second power voltage higher than the first power voltage is applied, and
 the shielding pattern is connected to the second power voltage line through a contact hole.

3. The display device of claim 2, wherein the light emitting control stage further includes a first capacitor including a first electrode connected to the second power voltage line and a second electrode connected to a second node.

4. The display device of claim 3, wherein the shielding pattern is disposed on the same layer as the second electrode of the first capacitor.

5. The display device of claim 1, wherein the light emitting control stage further includes a second light emitting control transistor including a first electrode connected to the first power voltage line, a gate electrode connected to a third node, and a second electrode connected to a fourth node.

6. The display device of claim 5, wherein the shielding pattern is disposed between the second light emitting control transistor and the first power voltage line in a layout view.

7. The display device of claim 6, wherein the light emitting control stage further includes a third light emitting control transistor including a first electrode connected to a fifth node, a gate electrode connected to the first power voltage line, and a second electrode connected to a sixth node.

8. The display device of claim 7, wherein the shielding pattern is disposed between the third light emitting control transistor and the first power voltage line in a layout view.

9. The display device of claim 1, wherein the first power voltage line extends in a first direction, and the shielding pattern includes a first portion extending in the first direction and a second portion extending in a second direction crossing the first direction.

10. The display device of claim 9, wherein the light emitting control stage further includes a light emitting blocking signal line receiving a light emitting blocking signal.

11. The display device of claim 10, wherein the second portion of the shielding pattern partially overlaps the light emitting blocking signal line.

12. The display device of claim 11, wherein the first portion of the shielding pattern is disposed between the first light emitting control transistor and the first power voltage line in a layout view.

* * * * *